United States Patent
Shi et al.

(10) Patent No.: US 12,442,691 B1
(45) Date of Patent: Oct. 14, 2025

(54) METHOD AND DEVICE FOR PHOTODETECTOR CIRCUIT WITH NEAR INFRARED COMPLIANT SUBSTRATE

(71) Applicant: Aeluma, Inc., Goleta, CA (US)

(72) Inventors: Bei Shi, Goleta, CA (US); Jonathan Klamkin, Goleta, CA (US); Simone Suran Brunelli, Goleta, CA (US); Bowen Song, Goleta, CA (US)

(73) Assignee: Aeluma, Inc., Goleta, CA (US)

( * ) Notice: Subject to any disclaimer, the term of this patent is extended or adjusted under 35 U.S.C. 154(b) by 277 days.

(21) Appl. No.: 18/355,608

(22) Filed: Jul. 20, 2023

(51) Int. Cl.
  *G01J 5/20* (2006.01)
(52) U.S. Cl.
  CPC ...................... *G01J 5/20* (2013.01)
(58) Field of Classification Search
  CPC ............................................ G01J 5/20
  See application file for complete search history.

(56) References Cited

U.S. PATENT DOCUMENTS

| | | | | |
|---|---|---|---|---|
| 6,541,803 B1 * | 4/2003 | Folkes | ............... | H10F 30/21 257/187 |
| 2002/0144725 A1 * | 10/2002 | Jordan | ............... | H10F 77/45 136/263 |
| 2013/0043214 A1 * | 2/2013 | Forrest | ............... | H10F 71/1395 428/457 |
| 2017/0194476 A1 * | 7/2017 | Brueck | ............... | H01L 21/0251 |

FOREIGN PATENT DOCUMENTS

JP          2019125776 A  * 7/2019 ......... H10F 77/1248

* cited by examiner

*Primary Examiner* — Edwin C Gunberg
*Assistant Examiner* — Richard O Toohey
(74) *Attorney, Agent, or Firm* — Richard T. Ogawa; Ogawa P.C.

(57) ABSTRACT

A method and device for a photodetector circuit using a near infrared (NIR) compliant substrate. The substrate includes a plurality of v-grooves formed within a front region and at least a first GaAs buffer region, a defect filter layer (DFL), and a second GaAs buffer region formed overlying. The device can also include an overlying wavelength configuring material having a graded region with a plurality of material regions configured in order of concentration with respect to at least a first element concentration, which can be configured for a selected wavelength. Then, photodetector device materials can be formed overlying the wavelength configuring material and can include at least an n-type contact region, an absorber region, a p-type spacer region, and a p-type contact region. These device materials can be configured in an array of photomultiplier (PM) devices, single photon avalanche detector (SPAD) devices, or the like.

20 Claims, 36 Drawing Sheets

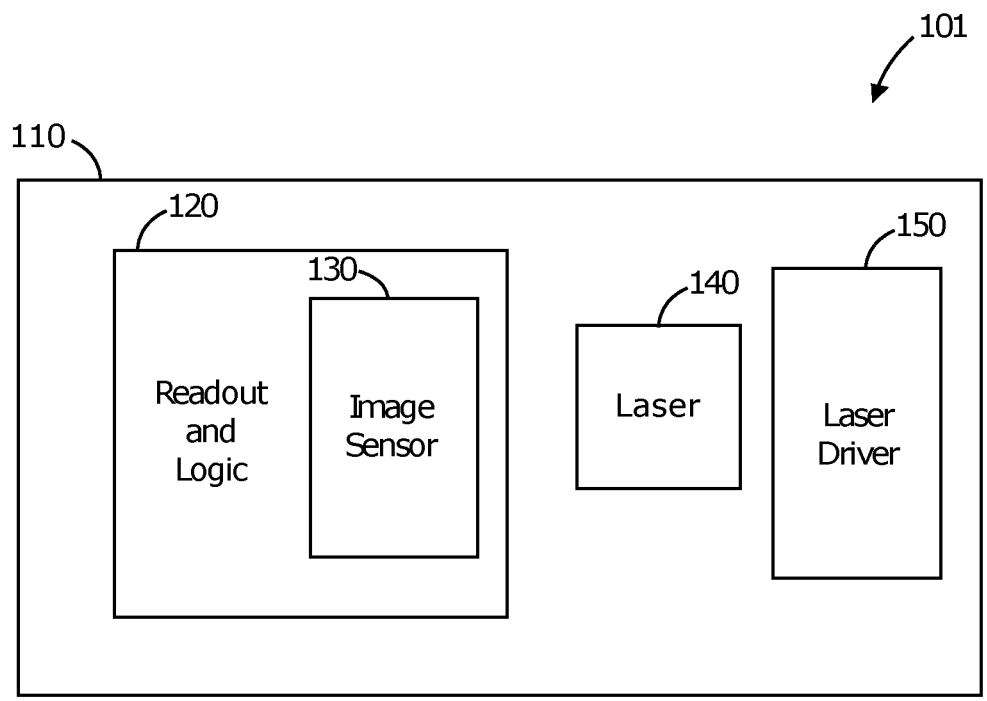
FIG. 1A
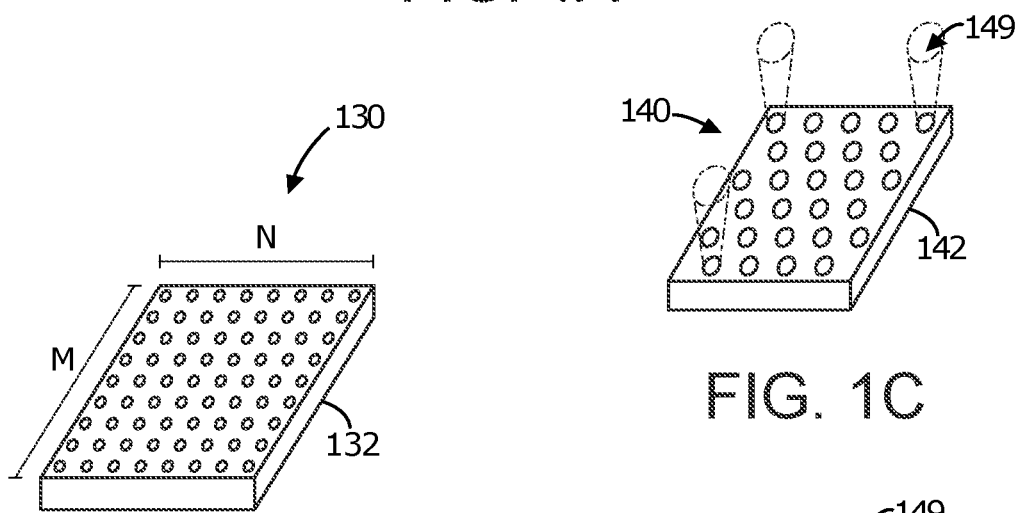
FIG. 1B
FIG. 1C
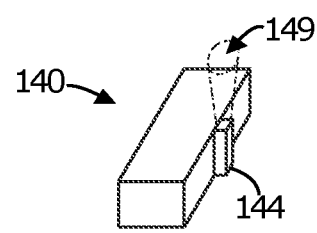
FIG. 1D

METHOD AND DEVICE FOR PHOTODETECTOR CIRCUIT WITH NEAR INFRARED COMPLIANT SUBSTRATE

CROSS-REFERENCES TO RELATED APPLICATIONS

The present application incorporates by reference, for all purposes, the following commonly owned patent application: U.S. patent application Ser. No. 18/062,467, filed Dec. 6, 2022.

BACKGROUND OF THE INVENTION

Electronic devices have proliferated over the years. From an iPhone 12 designed and sold by Apple Inc. to advanced networks for selling almost any type of good by Amazon.com Inc., electronic devices have entered into almost every aspect of our daily lives. These devices rely on miniature chips made from semiconductor materials, commonly silicon ("Si"). These silicon materials are also used to make sensing devices that can capture images of objects or scenes. Silicon is widely used because it is an abundant material and silicon-based semiconductor manufacturing is mature due to the investments made in the electronics industry. A common technology process is called complementary metal oxide semiconductor, or "CMOS." The CMOS technology was developed for manufacturing integrated circuits but is now used for image sensors and photodetectors. Such image sensors are called CMOS image sensors (CIS) and such photodetectors may be charge coupled devices (CCDs) or silicon single photon avalanche detectors (SPADs). Oftentimes, such CMOS sensors are manufactured using high-volume manufacturing with 8- and 12-inch silicon wafers. These image sensors and photodetectors are used for visible cameras and for near infrared (NIR) sensing. The latter form of these devices may be used for LiDAR scanning, facial recognition, proximity sensors, 3D imaging, and other applications. A common wavelength range for these sensors for such applications is about 900-940 nm.

Despite the advances with CMOS image sensors and photodetectors, limitations or drawbacks exist. For example, CMOS sensors have limitations in the detectable wavelength range. These CMOS sensors suffer from poor sensitivity at longer wavelengths within the detectable wavelength range. These and other limitations may also exist.

From the above, it is desired that the industry develops improved sensing devices.

BRIEF SUMMARY OF THE INVENTION

The present invention is generally related to electronic devices. More specifically, the present invention provides techniques related to optoelectronic devices such as, but not limited to, photodetectors and photodetector array circuits using heteroepitaxy of compound semiconductor ("CS") materials on silicon and other large-diameter substrates, along with subsequent circuit fabrication and integration methods. Merely by way of example, the present invention can be applied to various applications including image sensing, range finding, including LiDAR (light detection and ranging), among others, but it will be recognized that there are many other applications.

According to an example, the present invention provides a sensor device for a selected wavelength using a near infrared (NIR) compliant substrate. This device includes a silicon substrate having a backside region and a front region, which includes a plurality of v-grooves formed within. A first GaAs buffer region is configured overlying the plurality of v-grooves, a defect filter layer (DFL) is configured overlying the first GaAs buffer region, and a second GaAs buffer region is configured overlying the DFL region. In a specific example, the DFL region includes one or more DFLs and spacer layers configured in an alternative pattern, and these GaAs buffer regions can include relaxed GaAs buffer regions.

In an example, the device includes a wavelength configuring material overlying the second GaAs buffer region. This wavelength configuring material includes a graded region configured for a selected wavelength (e.g., about 900 nm to about 940 nm), and this graded region can have a plurality of material regions configured in order of concentration with respect to at least a first element concentration. In a specific example, the first element concentration includes $In_zGa_{1-z}As$, $In_zGa_{1-z}P$, or $In_zAl_{1-z}As$. Also, the plurality of material regions includes an interface region between each adjacent pair of material regions.

In an example, the device includes a photodetector device materials configured overlying the wavelength configuring material. These device materials include an n-type contact region overlying the wavelength configuring material, an absorber region overlying the n-type contact region, a p-type spacer region overlying the absorber region, and a p-type contact region overlying the p-type spacer region. In a specific example, the n-type contact region includes an n+ $In_zGa_{1-z}As$ contact region, an n+ $In_zGa_{1-z}P$ contact region, or an n+ $In_zAl_{1-z}As$ contact region; the absorber region includes an $In_zGa_{1-z}As$ absorber region; the p-type spacer region includes a p– $In_xGa_{1-x}As_yP_{1-y}$ spacer region, a p– InAlAs spacer region, a p– $In_zGa_{1-z}As$ spacer region, a p– $In_zGa_{1-z}P$ spacer region, or a p– $In_zAl_{1-z}As$ spacer region; and the p-type contact region includes a a p+ $In_xGa_{1-x}As_yP_{1-y}$ contact region, a p+ InAlAs contact region, a p+ $In_zGa_{1-z}As$ contact region, a p+ $In_zGa_{1-z}P$ contact region, or a p+ $In_zAl_{1-z}As$ contact region.

According to an example, this sensor device can include an N×M array of photomultiplier (PM) devices overlying the second buffer region. These PM devices can include the photodetector device materials discussed previously, and these materials can form single photon avalanche detector (SPAD) devices, which can be coupled to quenching resistors. Further, this sensor device can be configured for top-side illumination or backside illumination. Those of ordinary skill in the art will recognize other variations, modifications, and alternatives.

Benefits or advantages are achieved over conventional techniques. The integration platform based on heteroepitaxy of CS materials and device structures on Si by direct or selective heteroepitaxy enables large-volume manufacturing of optoelectronic devices, such as image sensor and laser arrays. The use of selectively transparent wavelength or graded configuring materials enables high performance at target wavelength ranges with low dislocation density. These devices fabricated using the present techniques can exhibit improved detectable wavelength range, higher sensitivity, and other related performance metrics. These and other benefits or advantages are described throughout the present specification and more particularly below.

A further understanding of the nature and advantages of the invention may be realized by reference to the latter portions of the specification and attached drawings.

BRIEF DESCRIPTION OF THE DRAWINGS

In order to better understand the present invention, reference is made to the accompanying drawings. Understanding that these drawings are not to be considered limitations in the scope of the invention, the presently described embodiments and the presently understood best mode of the invention are described with additional detail through use of the accompanying drawings in which:

FIG. 1A is a simplified diagram of a top-view of a photodetector module device, integrated with a laser emitter and laser driver, according to an example of the present invention;

FIG. 1B is a simplified diagram of a perspective view of an example image sensor array chip of the photodetector module device shown in FIG. 1A;

FIG. 1C is a simplified diagram of a perspective view of an example laser chip of the photodetector module device shown in FIG. 1A;

FIG. 1D is a simplified diagram of a perspective view of an example laser chip of the photodetector module device shown in FIG. 1A;

DETAILED DESCRIPTION OF THE INVENTION

Figure 1E:
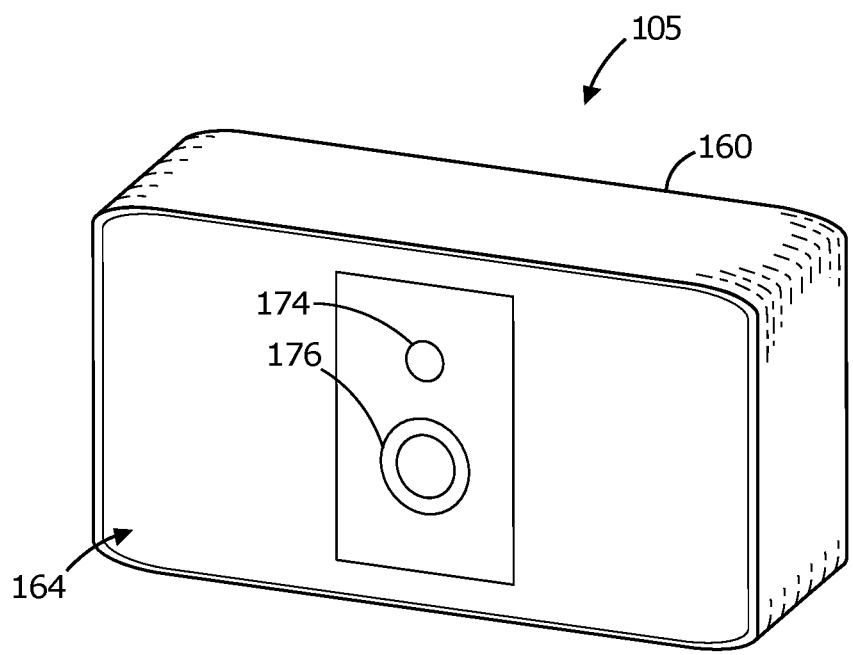
FIG. 1E is a simplified diagram of a front perspective view of a photodetector module device according to an example of the present invention.

The present invention is generally related to electronic devices. More specifically, the present invention provides techniques related to optoelectronic devices for mobile applications such as, but not limited to, photodetectors and photodetector array circuits using heteroepitaxy of CS materials on Si and other large-diameter substrates, along with subsequent circuit fabrication and integration methods. Merely by way of example, the present invention can be applied to various applications including image sensing, range finding, LiDAR, among others, but it will be recognized that there are many other applications.

In an example, the present invention provides method and device for realizing highly manufacturable and scalable semiconductor optoelectronic devices, including photodetector circuit arrays, on Si substrates that can be implemented in a variety of module devices. By directly depositing CS materials on Si substrates, mature Si microelectronics manufacturing processes can be leveraged to fabricate high performance photodetector circuits. Deposition on 8- and 12-inch Si substrates, which are common for CMOS technologies, enables the subsequent fabrication in CMOS manufacturing lines, however, the technology is not limited to 8- and 12-inch Si substrates only. CS materials can be deposited directly onto Si substrates with the techniques described in the present invention.

The technique to describe the direct deposition of CS materials is referred to herein as heteroepitaxy. The heteroepitaxy step or steps may be carried out with techniques including, but not limited to, metalorganic chemical vapor deposition (MOCVD), molecular beam epitaxy (MBE), metalorganic MBE (MOMBE), chemical beam epitaxy (CBE), hydride vapor phase epitaxy (HVPE), liquid phase epitaxy (LPE), or any combination thereof.

In addition to Si substrates, alternative substrates may be used including, but not limited to, silicon on insulator (SOI), miscut Si, SOI on miscut Si, germanium (Ge) on Si, Ge, or gallium arsenide (GaAs) substrates, without departing from the scope of the invention.

In an embodiment of the present invention, CS material is deposited onto a Si substrate by heteroepitaxy, by firstly depositing a buffer material that includes an initial nucleation on the Si surface and enables the trapping, annihilation, and/or filtering of defects near the interface between the CS material and the Si surface. The initial nucleation step may be carried out at a relatively low temperature, and the subsequent buffer material growth intended to trap, annihilate and/or filter defects may be carried out at a higher temperature. Surface treatment may be carried out prior to the initial nucleation on the Si surface. This treatment may include, but is not limited to, chemical cleaning and/or treatment of the Si surface, reordering of the Si surface with high-temperature annealing in an ambient, high-temperature annealing in an ambient to remove and/or treat a surface oxide, or the formation of various Si crystal planes by treatment or etching.

The initial nucleation and buffer growth can be carried out with a number of methodologies, and combinations of methodologies, including, but not limited to, initial group IV (e.g., Si or Ge material) growth for surface reordering or reparation followed by CS growth for defect trapping, or Si surface patterning or structuring, that may include formation of various Si crystal planes, followed by CS nucleation and growth, or low-temperature CS nucleation, or low-temperature CS nucleation followed by multi-step growth with temperature grading for defect bending and annihilation, or use of strained layer superlattices (SLSs), interfaces with high strain fields, graded or step-graded layers, or other similar techniques to redirect, trap, convert, and/or annihilate defects.

The techniques of the present invention can be used to manufacture various optoelectronic devices in high volumes by leveraging Si manufacturing methods. These devices include, but are not limited to, lasers that are either edge-emitting or vertical cavity surface emitting, optical modulators, photodetectors or photodiodes, semiconductor optical amplifiers, and nonlinear devices for optical frequency comb generation. Specific to image sensors and photodetector circuit arrays, various device structures could be realized by heteroepitaxy deposition of device layers and subsequent fabrication steps. These device structures include, but are not limited to, planar photodiodes, mesa photodiodes, double mesa photodiodes, PIN or NIP photodiodes, avalanche photodiodes (APDs), charge coupled devices (CCDs), single photon avalanche detectors (SPADs), and uni-traveling-carrier (UTC) photodiodes.

The optoelectronic devices and device arrays realized with deposition of CS materials on Si can be leveraged in various applications, including, but not limited to, LiDAR; LiDAR for autonomous vehicles including, but not limited to, automobiles, aerial vehicles, airplanes, jets, drones, robotic vehicles; advanced driver assistance systems (ADAS); LiDAR for mobile devices including, but not limited to, phones and tablets; imaging for camera applications including, but not limited to, digital cameras, mobile phones, tablets; imaging and perception for robots, artificial intelligence (AI) applications, augmented reality (AR) applications, and virtual reality (VR) applications; 3D imaging and sensing; defense and aerospace; industrial vision, factory automation; medical and biomedical imaging; topography, weather, and wind mapping; gas sensing; infrared (IR) and near infrared (NIR) imaging and sensing; smart building, security, people counting; proximity sensing; facial recognition, thermal imaging, thermography; heating, ventilation and air conditioning (HVAC);

In addition to the group III-V CS materials, the techniques of the present invention could apply to other materials for photodetector circuits including, but not limited to, II-VI compounds, IV-VI compounds, II-V compounds, or IV-IV compounds.

In another embodiment, the CS nucleation, buffer materials and subsequent photodetector materials may be deposited and formed by selective area heteroepitaxy, whereby the Si or similar substrate could be first patterned with a dielectric to form recesses, within which the CS nucleation, the buffer materials and the photodetector materials could be selectively deposited. Selective area heteroepitaxy is the process by which the Si substrate would be patterned with a dielectric, and the subsequent deposition of semiconductor materials would deposit selectively on the exposed Si surfaces but not on the dielectric surfaces. Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

The techniques described above can be applied to an integrated circuit configured for a module device. FIG. 1A is a simplified diagram of a top-view of a photodetector module device, integrated with a laser emitter and laser driver, according to an example of the present invention. As shown, device 101 includes a circuit board 110 (e.g., printed circuit board (PCB), or the like) with a readout/logic device 120, an image sensor device 130, a laser device (or laser array) 140, and a laser driver 150 configured on top. In this case, the image sensor chip 130 is bonded face-down overlying the readout/logic chip 120. The laser array chip 140, configured by its associated laser driver 150, emits one or more output beams that are reflected off of a target and return to be imaged by the image sensor chip 130. FIGS. 1B-1D show additional details or variations for certain components of device 101. FIG. 1B shows a perspective view of an example image sensor chip 130 configured as an array 132 with M×N pixel elements. The laser array chip 140 can be a VCSEL (vertical cavity surface emitting laser) array 142, as shown in FIG. 1C, an EEL (edge emitting laser) 144, as shown in FIG. 1D, or the like. Example output beams 149 are shown by dotted lines in both examples.

Figure 1F:
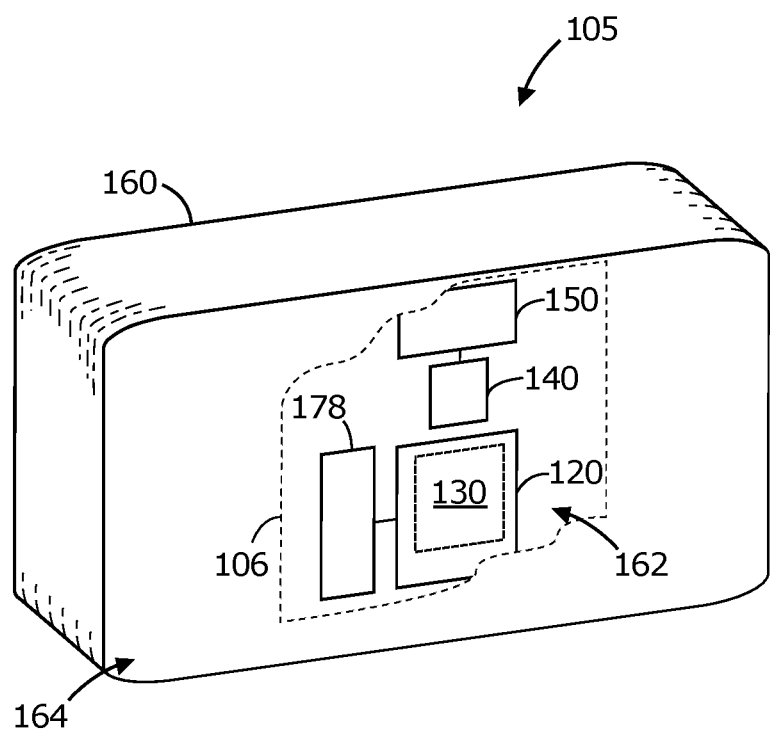
FIG. 1F is a simplified diagram of a back perspective view of a photodetector module device according to an example of the present invention.

According to an example, the present invention provides a photodetector module device. As shown in FIG. 1E (front perspective view) and FIG. 1F (back perspective view), an example photodetector module device 105 can have a housing 160 with an exterior region 162 and an interior region 164. The exterior region includes an emitting portion 174 and a sensing portion 176. In this case, the emitting portion 174 and the sensing portion 176 are configured on the front-side of the exterior region 162. There can be other configurations, such as having the sensing and detecting portions 172, 174 on the backside or on both sides.

The emitting portion 174 of the module device 105 can be coupled to a laser device 140 configured to emit electromagnetic radiation. This laser 140 can be spatially disposed to include an aperture configured on the emitting portion 174 of the exterior region of the housing 160. In an example, the electromagnetic radiation emission can have a wavelength range between 850 nm to 1550 nm. In a specific example, the wavelength range is 940 nm. The laser device 140 can be a VCSEL array device (see FIG. 1C), an EEL device (see FIG. 1D), a laser device coupled to a mirror device, or the like.

The sensing portion 176 of the module device 105 can be coupled to an image sensor device 130 configured to detect photons and convert them to electrical signals. This image sensor can be spatially disposed to include an aperture configured on the sensing portion 176 of the exterior region 162 of the housing 160. The image sensor 130 and laser 140 can be configured similar to the integrated circuit device 101 shown in FIG. 1A. As shown in the interior region 164 (dotted line cutaway 106 in FIG. 1F), the image sensor 130 is electrically coupled to a logic/readout circuit 120. In this case, the image sensor 130 is facing the front-side of the device 105 (indicated by dotted lines). Further, the laser 140 is electrically coupled to the laser driver 150.

The module device 105 can further include a classifier module 178 coupled within the interior region 164 of the housing 160. In an example, the classifier module 178 can be coupled to the logic/readout circuit 120 to further process the data collected by the image sensor 130. This classifier module 178 can include a classification of one or more classes including a speed sensing, image sensing, facial recognition, distance sensing, acoustics sensing, thermal sensing, color sensing, biosensing (i.e., via a biological sensor), gravitational sensing, mechanical motion sensing, or other similar sensing types.

In an example, the image sensor 130 is a photodetector circuit that includes a CS material stack formed overlying a Si substrate. This material stack can include a buffer material and an array of photodetectors configured from an n-type material, an absorption material, and a p-type material. Each photo detector also includes an illumination region, a first electrode coupled to the n-type material and a first terminal, and a second electrode coupled to the p-type material and a second terminal. Further details of the photodetector circuit are discussed in reference to the remaining figures.

This module device 105 can be configured for virtual reality (VR), a mobile phone, a smartphone, a tablet computer, a laptop computer, a smart watch, an e-reader, a handheld gaming console, or other mobile computing device. Alternatively, the module device 105 can be configured for automobiles, aerial vehicles, airplanes, jets, boats, drones, robotic vehicles, ADAS, and the like. Those of ordinary skill in the art will recognize other variations, modifications, and alternatives to the device configurations and applications discussed previously.

Figure 1G:
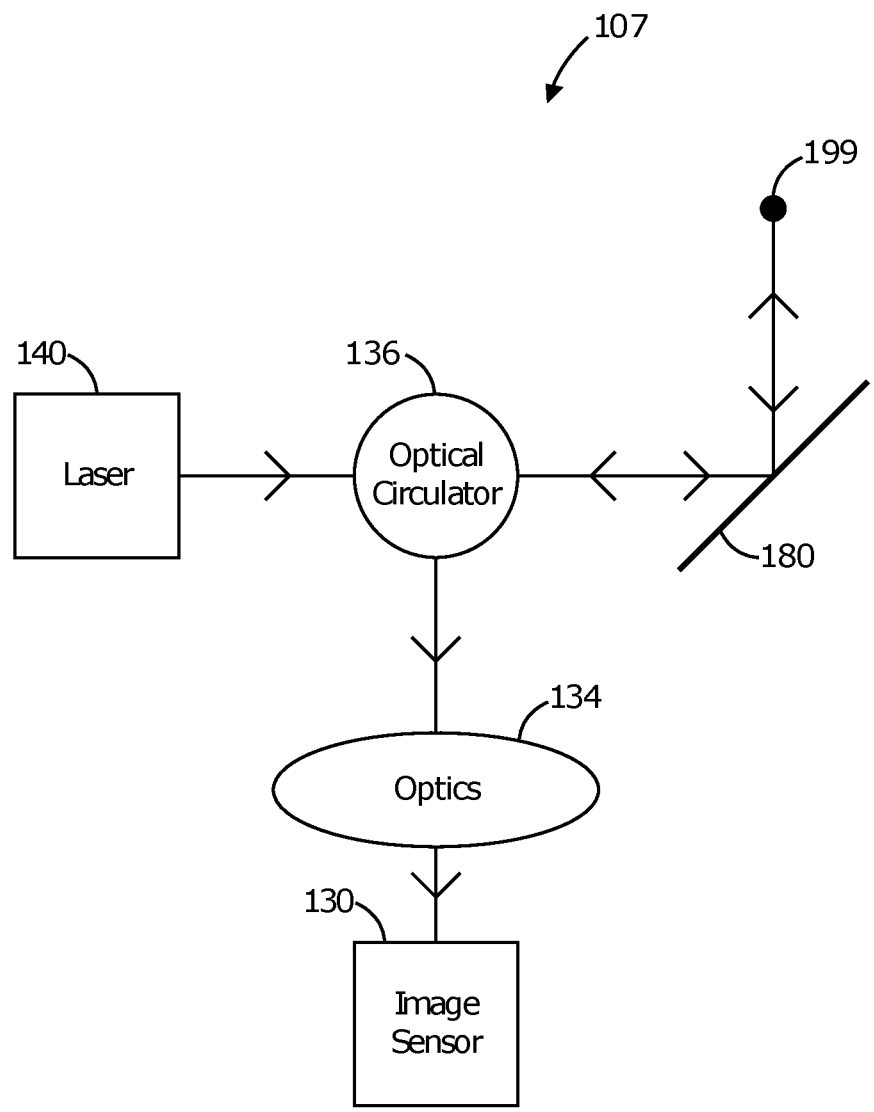
FIG. 1G is a simplified block diagram of a LiDAR system according to an example of the present invention.

FIG. 1G is a simplified block diagram illustrating a LiDAR system according to an example of the present invention. As shown, system 107 includes an image sensor device 130, optics 134, a laser device (or laser array) 140, a movable mirror 180 optically coupled to an optical circulator 136. In this configuration, the movable mirror 180 can steer one or more outgoing beams coming from the laser 140 (through the optical circulator 136) to an object/point of reflection 199. Then, one or more return beams from that object/point of reflection 199 are imaged with the image sensor 130 (i.e., reflected from the movable mirror 180 and directed by the optical circulator 136 through the optics 134 to the image sensor 130). Using this optical path between these elements (shown by the lines with directional arrows), the movable mirror 180 may steer in 2D to enable 3D imaging of a scene or object. Of course, there can be other variations, modifications, and alternatives to this example LiDAR system.

Figure 2A:
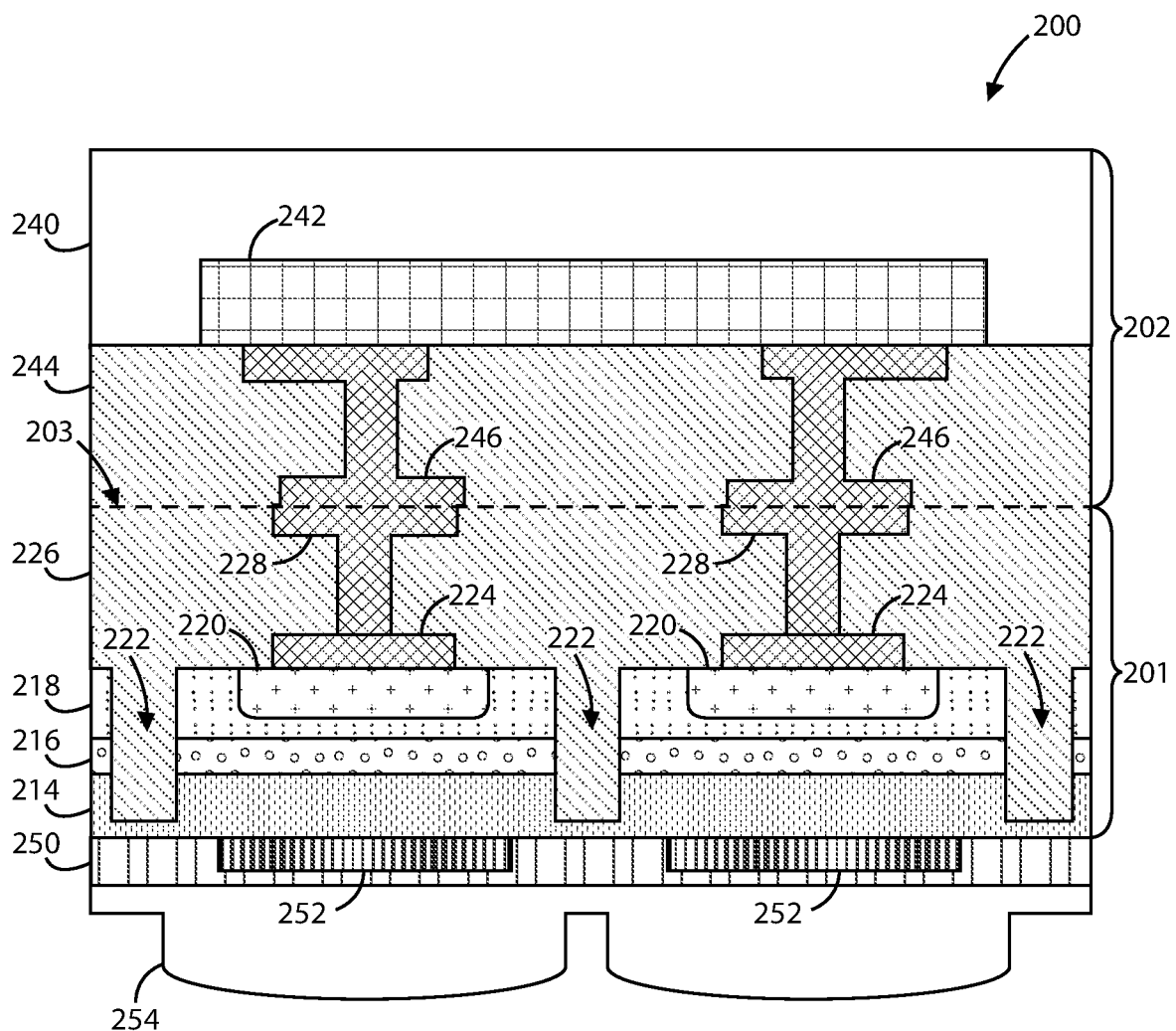
FIG. 2A is a simplified diagram of a circuit device including a photodetector array circuit coupled to a readout circuit according to an example of the present invention.

FIG. 2A is a simplified diagram of a circuit device 200 including a photodetector array circuit 201 coupled to a readout circuit 202 according to an example of the present invention. As shown, the photodetector circuit 201 is bonded to the CMOS readout circuit 202 at the bond interface 203. The steps for front-end fabrication of the photodetector circuit and the CMOS circuit may vary in detail or order, without departing from the scope of the invention. In an example, each photodetector device structure in the array 201 is formed with an n-type CS material 214, a CS absorption material 216, a p-type CS material 220 (configured within a CS material 218), a p-metal contact 224 coupled to a first terminal 228 (i.e., the cathode), and an n-metal contact coupled to a second terminal 232 (i.e., the anode). The n-metal contact/second terminal coupling may be made from the topside of the photodetector circuit 201, or from the backside, without departing from the scope of the invention. These photodetector devices can be separated by isolation trenches 222.

Figure 2B:
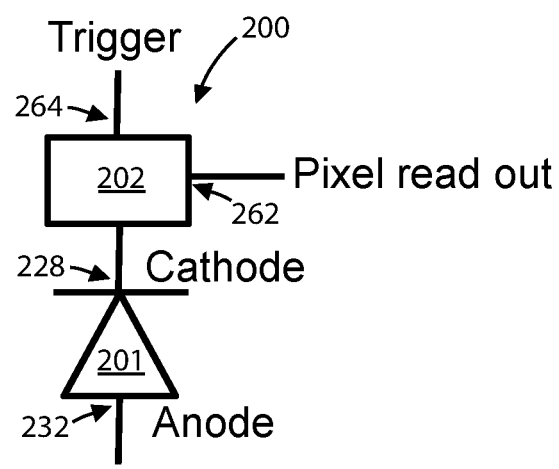
FIG. 2B is a simplified circuit diagram of the photodetector array circuit coupled to the readout circuit shown in FIG. 2A.

The readout circuit 202 comprises a Si substrate 240, which can include the readout integrated circuits (ROIC) 242 and other front-end integrated circuits (ICs). The metal layers of the readout circuit 202 within the dielectric layer 244 can include terminals (e.g., first input terminals 246 and second input terminals). The first input terminals 246 of the readout circuit 202 can connect to the cathode terminals 228 of the photodetector 201 at the bond interface 203. FIG. 2B shows a simplified circuit diagram representation of device 200 with the photodetector 201 coupled to the readout circuit 202 with terminals for pixel read out 262 and triggering 264. In an example, the second input terminal of the readout circuit 202 is coupled to the second terminal 232 of the photodetector 201. Those of ordinary skill in the art will recognize other variations, modifications, and alternatives to the configuration for metal contacts and terminal connections.

The steps for the backend fabrication, including bonding, backside contact, optical coating, color filter integration, or lens attachment, may vary in detail or order, without departing from the scope of the invention. In an example of the invention, the Si handle substrate and some of the CS materials (see substrate 210 and CS buffer material 212 in FIG. 3) are removed from the backside of the photodetector circuit following face-to-face bonding to the Si CMOS circuit. This removal process can be used to form an illumination region configured to allow light to interact with the photodetector materials (e.g., CS absorption material). An optical coating 250 and/or color filters 252 may be applied to the n-type CMOS material to assist in defining the illumination apertures for pixel elements. A lens array 254 may be coupled to the optical coating 250/color filter 252 for increasing the coupling of light to each pixel element to improve the responsivity of the photodetector circuit. The photodetector circuit of FIG. 2 represents a back side illuminated (BSI) photodetector. A modified front side illuminated (FSI) photodetector circuit may be realized by CS heteroepitaxy on Si without departing from the scope of the invention.

Figure 3:
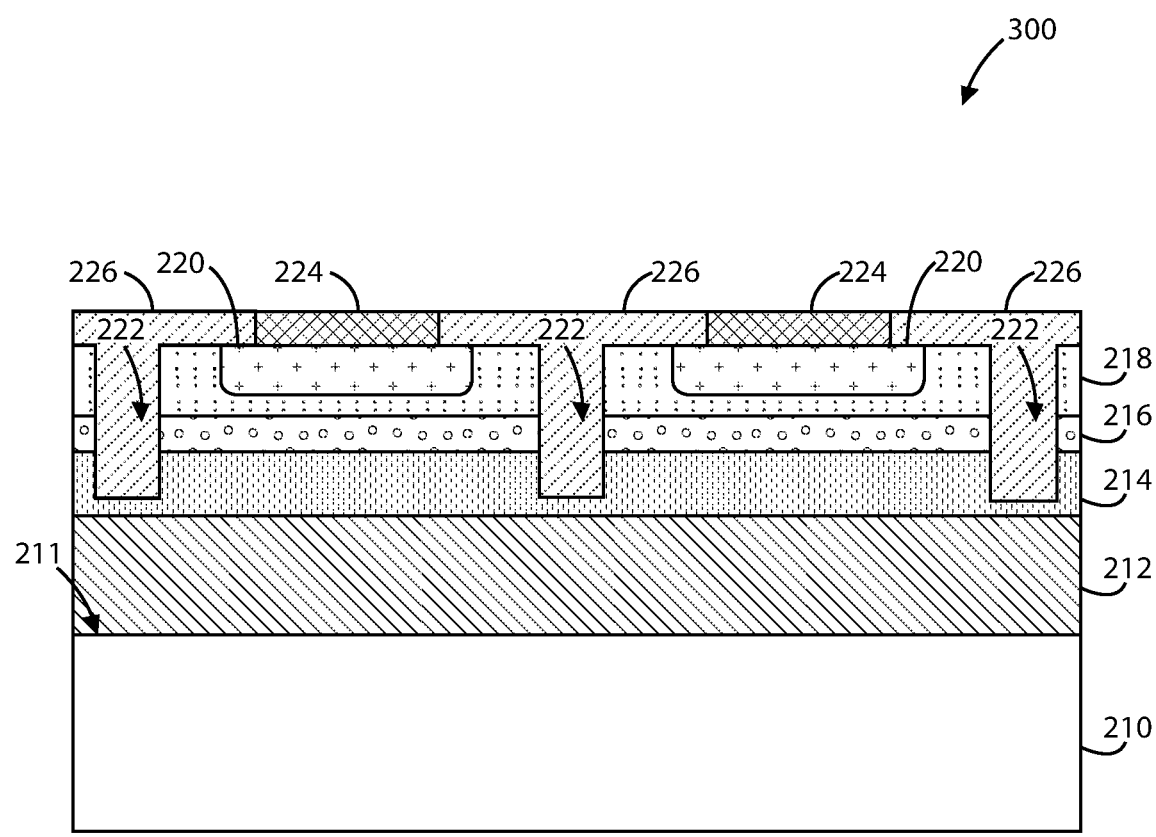
FIG. 3 is a simplified diagram of a photodetector circuit device according to an example of the present invention.

FIG. 3 is a simplified diagram of a photodetector array circuit device 300 according to an embodiment of the present invention. As discussed previously, the present invention can include depositing CS materials overlying a Si substrate by heteroepitaxy to form a CS material stack. Device 300 can represent a prior fabrication stage of the photodetector array circuit (device 201 of FIG. 2) that is bonded to the CMOS circuit (device 202 of FIG. 2). Here, a CS buffer material 212 is spatially configured overlying the Si surface 211 of the Si substrate 210. Photodetector device materials, including an n-type CS material 214, an CS absorption material 216, a CS material 218, are spatially configured overlying the CS buffer material 212. One or more p-type CS regions 220 are configured within one or more portions of the CS material 218. One or more isolation trenches 222 are configured within portions of the photodetector device materials (i.e., layers 214, 216, and 218) and filled with a dielectric material 226 for optical or electrical isolation, or alternatively or inclusively with other material such as a metal, which can separate individual CS photodetector devices of the array.

Each of the photodetectors can be configured with metal contacts (or electrodes) to the n-type CS material 214 and to the p-type CS materials 220. In FIG. 3, a p-contact metal 224 is configured overlying each of the p-type CS materials 220, and, although not shown, n-contact metals can be coupled to the n-type CS material 214. The n-metal contact and coupling may be made from the topside of the photodetector circuit 212, or from the backside, without departing from the scope of the invention. The p-contact metals 224 can be further coupled to a first terminal 228 (e.g., a cathode), and the n-contact metals can be coupled to a second terminal (e.g., an anode).

According to an example, the present invention provides a circuit for a photodetector. The photodetector circuit includes a buffer material formed (or deposited) overlying a surface region of a Si substrate, or the like. This buffer material can include a CS material deposited on the surface region of the Si substrate using direct heteroepitaxy such that the CS material is characterized by a first bandgap characteristic, a first thermal characteristic, a first polarity, and a first crystalline characteristic. Compared to the buffer material, the Si substrate is characterized by a second bandgap characteristic, a second thermal characteristic, a second polarity, and a second crystalline characteristic.

In a specific example, the CS material can include InP, InGaAs, gallium arsenide (GaAs), gallium phosphide (GaP), indium gallium arsenide phosphide (InGaAsP), indium aluminum gallium arsenide (InAlGaAs), indium aluminum arsenide (InAlAs), indium arsenide (InAs), indium gallium phosphide (InGaP), or a combination thereof.

The photodetector circuit also includes an array of photodetectors. This array is characterized by N and M pixel elements (i.e., N×M array; N>0, M>0). In a specific example, N is an integer greater than 7, and M is an integer greater than 0. Each of these pixel elements has a characteristic length ranging from 0.3 micrometers to 50 micrometers. Also, each of the photodetectors includes an n-type material, an absorption material overlying the n-type material, and a p-type material overlying the absorption material.

In a specific example, the n-type material can include an InP material with a silicon impurity having a concentration ranging from $5E17$ $cm^{-3}$ to $5E18$ $cm^{-3}$ overlying the buffer material. The absorption material can include an InGaAs containing material and can be primarily (or substantially) free from any impurity. And, the p-type material can include a zinc impurity or a beryllium impurity having a concentration ranging from $5E17$ $cm^{-3}$ to $1E20$ $cm^{-3}$.

In an alternative photodetector CS device structure, the n-type material includes a GaAs material comprising a silicon impurity having a concentration ranging from $5E17$ $cm^{-3}$ to $5E18$ $cm^{-3}$, the absorption material includes an InAs quantum dot material, and the p-type material includes a zinc impurity or a beryllium impurity or a carbon impurity having a concentration ranging from $5E17$ $cm^{-3}$ to $1E20$ $cm^{-3}$.

Additionally, the photodetector device structure can be configured with a separate absorption material comprising InGaAs, InAlGaAs, or InGaAsP, and a multiplication material comprising InP whereby the multiplication material generates additional charge carriers by avalanche gain.

The photodetector circuit also includes a first electrode coupled to the n-type material and coupled to a first terminal, as well as a second electrode coupled to the p-type material and coupled to a second terminal. This configuration defines each photodetector as a two-terminal device (i.e., having anode and cathode terminals).

The photodetector circuit also includes an illumination region characterized by an aperture region to allow a plurality of photons to interact with the CS material and be absorbed by a portion of the absorption material to cause a generation of mobile charge carriers that produce an electric current between the first terminal and the second terminal. In a specific example, the Si substrate is configured to allow the photons to traverse there through. The illumination region can also be configured to be free from any portion of the silicon substrate. A color filter can be configured overlying (or otherwise coupled to) the illumination region, and a lens can be configured overlying (or otherwise coupled to) the color filter.

Further, the photodetector circuit is characterized by a responsivity greater than 0.5 Amperes/Watt characterizing the circuit between the first terminal and the second terminal, and a photodiode quantum efficiency greater than 50% as measured between the first terminal and the second terminal. The photodetector circuit can be characterized as a BSI device or a FSI depending upon the application.

The photodetector circuit device can further include an analog front-end circuit, such as a ROIC, coupled to the array of photodetectors. The ROIC includes a first input terminal, a second input terminal, and a pixel output. The first and second input terminals are coupled to the first and second terminals of the photodetectors, respectively. The photodetector circuit can also include analog-to-digital conversion functionality (e.g., configured with or as part of the ROIC. There can be other variations, modifications, and alternatives to the elements and configurations discussed above.

Further details of example fabrication methods related to devices 200 and 300 are discussed below in reference to FIGS. 4-9.

FIGS. 4-9 are simplified diagrams illustrating methods of fabricating a compound semiconductor (CS) photodetector circuit device according to an example of the present invention. In these figures, shared reference numerals in subsequent figures refer to the same elements as described in previous figures.

Figure 4:
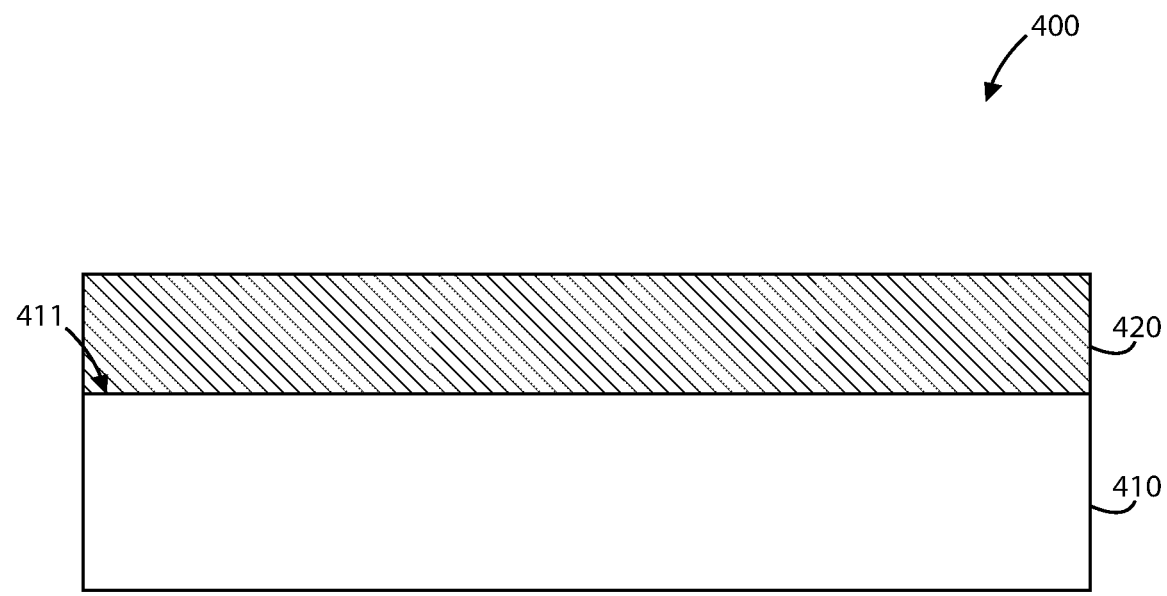
FIG. 4 is a simplified diagram of a device including CS buffer materials on a Si substrate realized by heteroepitaxy according to an example of the present invention.

FIG. 4 is a simplified diagram of a device 400 including CS buffer materials on a Si substrate realized by heteroepitaxy according to an example of the present invention. In this embodiment, a CS buffer material 420 is deposited overlying a surface region 411 of a Si substrate 410 in order to nucleate the CS material 420 and to trap and/or filter defects within the buffer material 420 and near the interface between the CS material 420 and Si surface 411. The initial nucleation and buffer material growth may be carried out with a number of methodologies, and combinations of methodologies, including, but not limited to, initial group IV material growth for surface reordering followed by group III-V CS growth for defect trapping; Si surface patterning or structuring, that may include formation of various Si crystal planes, followed by CS nucleation and growth; low-temperature CS nucleation; low-temperature CS nucleation followed by multi-step growth with temperature grading for defect bending and annihilation; use of strained layer superlattices (SLS), interfaces with high strain fields, graded or step-graded materials, or other similar techniques to redirect, trap, convert, and/or annihilate defects.

Figure 5:
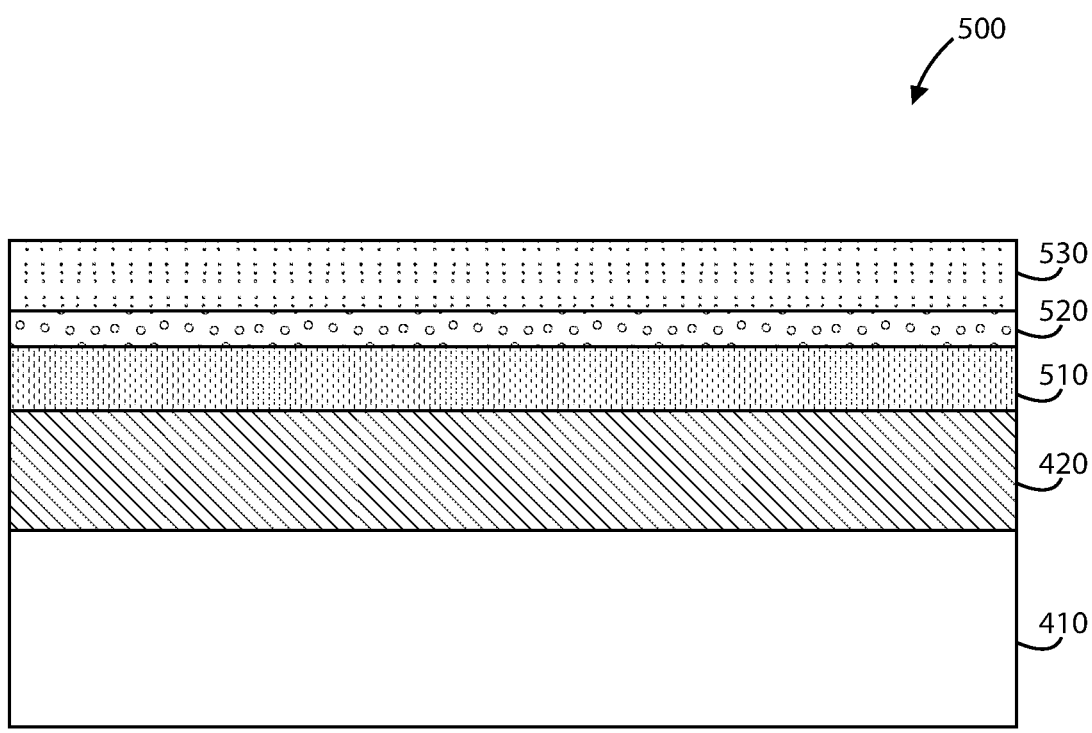
FIG. 5 is a simplified diagram of a device including CS buffer materials and CS device materials for a photodetector on a Si substrate realized by heteroepitaxy according to an example of the present invention.

As shown in device 500 of FIG. 5, following the formation of the CS buffer material 420, the photodetector device materials may be deposited overlying the CS buffer material 420 and Si substrate 410. The photodetector device materials can include an n-type CS material 510, a CS absorption material 520, and a CS material 530. In this embodiment, the CS device materials that are deposited overlying the buffer on Si (e.g., device 400 of FIG. 4) may form planar photodiode structures for the photodetector array circuit.

The n-type CS material 510 comprises a Si doping impurity and is formed overlying the buffer on Si. The CS absorption material 520, which is formed overlying the n-type material 510, is highly absorptive of light with a characteristic wavelength or wavelength range of interest. The absorption material 520 is primarily free from impurities. The CS material 530, which is formed overlying the absorption material 520, is deposited without intentional impurity. The various materials illustrated may comprise of band smoothing layers, diffusion block layers, a separate absorption layer, a charge layer, or a multiplication layer. Those of ordinary skill in the art will recognize other variations, modifications, and alternatives.

Figure 6:
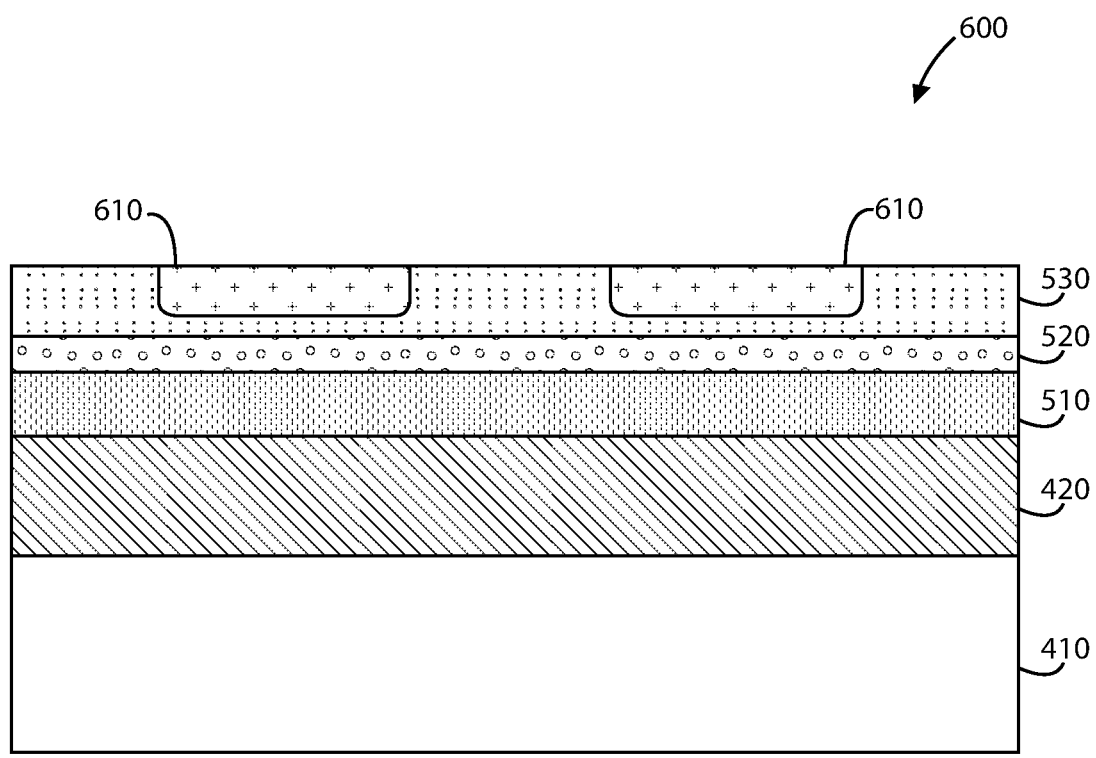
FIG. 6 is a simplified diagram of a device including CS buffer materials, CS device materials, and p-doped regions formed by diffusion, on a Si substrate realized by heteroepitaxy according to an example of the present invention.

As shown in device 600 of FIG. 6, the p-type material 610 for each photodetector is formed within a portion of the CS material 530. Depending on the specific CS material used for element 530, the p-type material 610 can be formed with diffusion of an impurity material that may be zinc, beryllium, or carbon, or the like.

Figure 7:
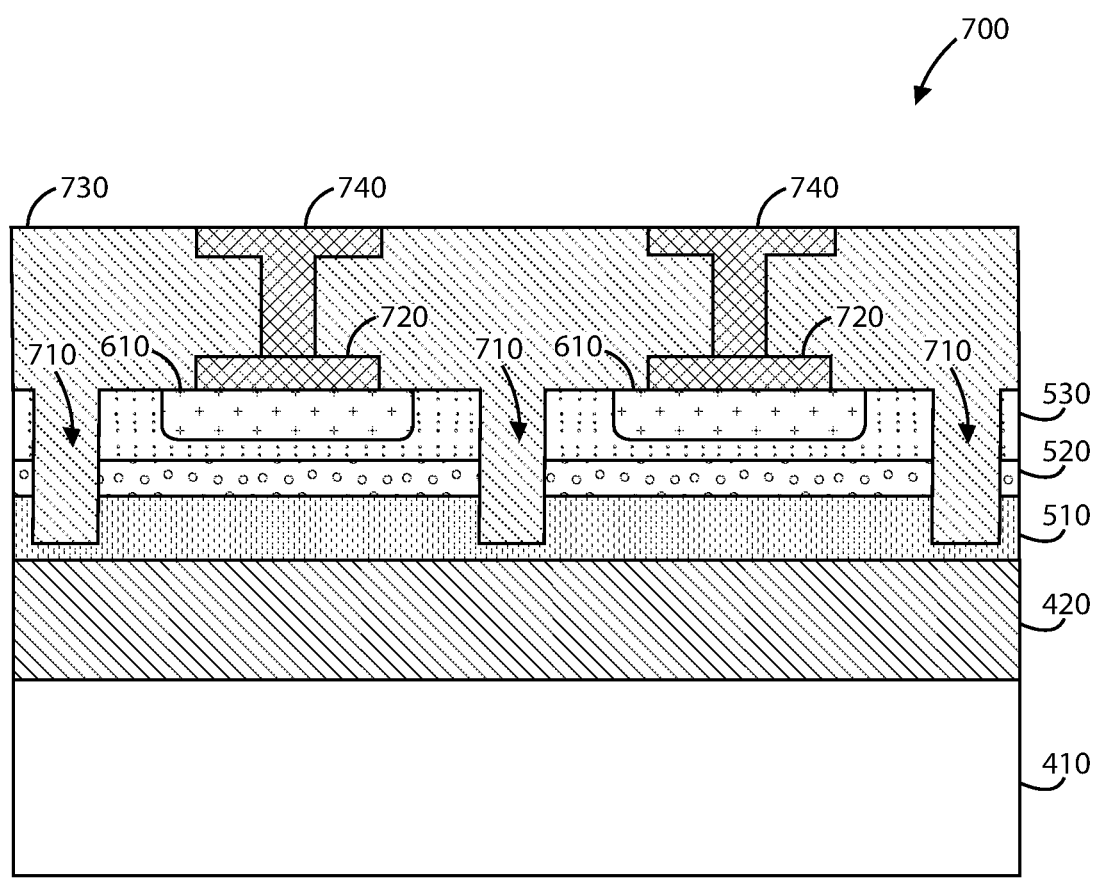
FIG. 7 is a simplified diagram of a device including CS buffer materials, CS device materials, p-doped regions formed by diffusion, isolation trenches, a planar film, metal contacts, vias, metal in vias, and top metal formed in trenches, on a Si substrate realized by heteroepitaxy according to an example of the present invention.

FIG. 7 illustrates the photodetector circuit 700 following the completion of the front-end fabrication steps (e.g., as shown previously in FIGS. 4-6). Isolation trenches 710 may be formed within portions of the photodetector device materials (i.e., layers 510-530) for optical or electrical isolation, and, in combination, to expose the n-type layer 510 (e.g., to form one or more n-contact metals). One or more p-contact metals 720 can be formed overlying the p-type materials 610. A dielectric material 730 may be deposited overlying the p-contact metals 720, the p-type materials 610, and the photodetector device materials. In this case, the dielectric material 730 also fills isolation trenches 710. Additional vias and trenches may be formed to expose the p-contact metals 720, and then the vias and trenches may be filled with metal materials 740 to provide metal connections to the p-contact metals 720 at the exposed surface region of the dielectric material 730. Of course, there can be other variations, modifications, and alternatives.

Photodetector device structures formed could include, but are not limited to, PIN photodiodes, APDs, CCDs, SPADs, UTC-PDs, mesa photodiodes, or planar photodiodes. Photodetectors could leverage bulk absorptive layers, including, but not limited to, InGaAs, InAlGaAs, InGaAsP, or could alternatively leverage quantum wells, quantum dashes, or quantum dots. Those of ordinary skill in the art will recognize other variations, modifications, and alternatives.

Figure 8:
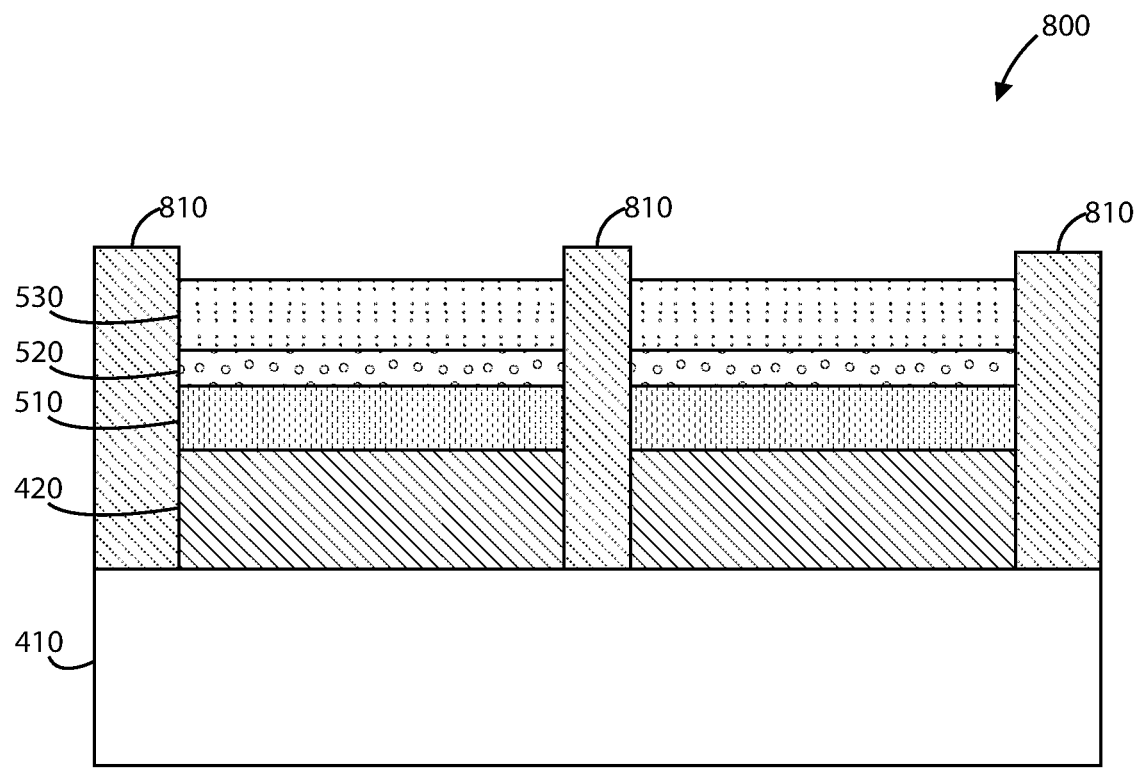
FIG. 8 is a simplified diagram of CS buffer materials and CS device materials deposited on a Si substrate realized by selective area heteroepitaxy that leverages a patterned dielectric according to an example of the present invention.
Figure 9:
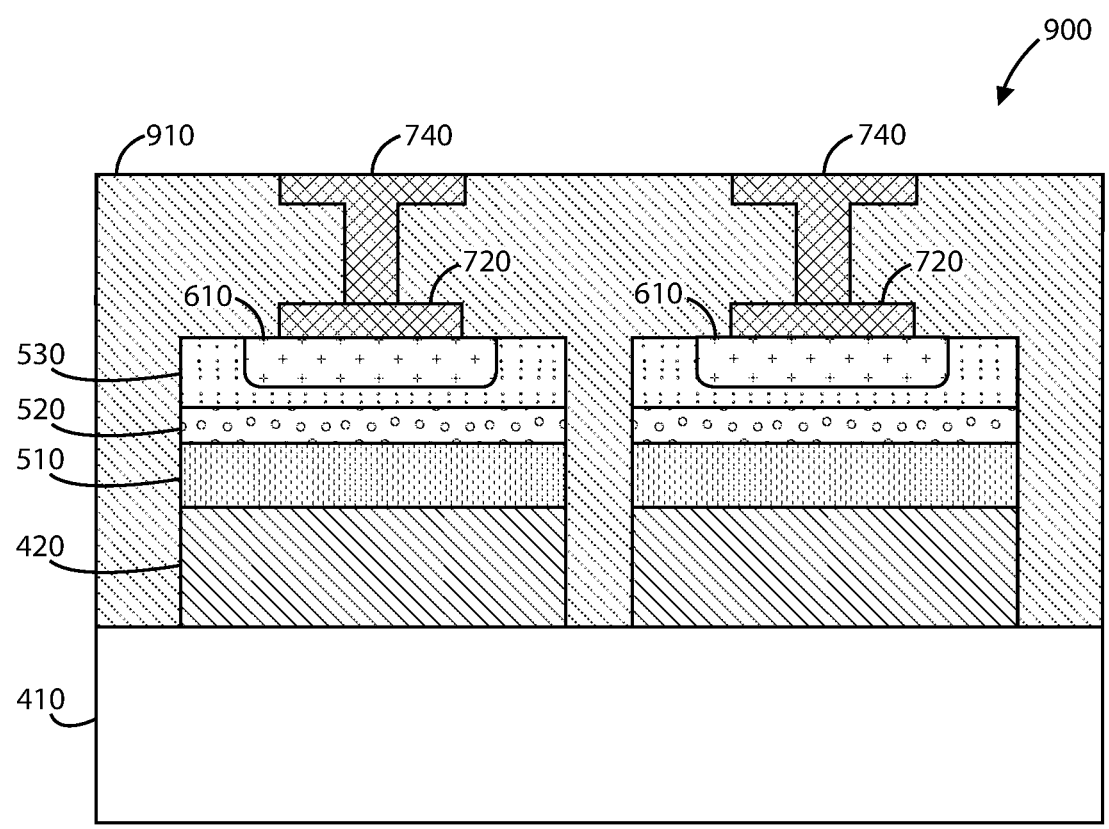
FIG. 9 is a simplified diagram of CS buffer materials, CS device materials, p-doped regions formed by diffusion, isolation trenches formed, a planar film formed, metal contacts formed, vias formed, metal in vias formed, and top metal formed in trenches, on a Si substrate realized by selective area heteroepitaxy, according to an example of the present invention.

FIG. 8 represents an alternative embodiment of a photodetector circuit 800 whereby the CS materials are deposited on the Si surface by selective area heteroepitaxy, whereby the Si surface is firstly patterned with a dielectric material 810 to form recesses, within which the CS materials would be selectively deposited on the exposed Si surface while not depositing on the dielectric material. The materials may comprise of similar or identical layers as those described for FIG. 7 (denoted by the same reference numerals). As illustrated in FIG. 9, the front-end fabrication steps for the photodetector circuit 900 following the selective heteroepitaxy of the CS materials (shown in FIG. 8) may be similar or identical to those steps utilized to form the photodetector circuit 700 in the embodiment of FIG. 7 (denoted by the same reference numerals). As shown, the dielectric material 910 (combined with dielectric material 810, if not removed) isolates the two CS material stacks formed by selective area heteroepitaxy.

Selective area heteroepitaxy is beneficial for improving the quality of the CS material on Si, for facilitating photodetector fabrication, and also for realization of novel device structures. Selective area heteroepitaxy can improve material quality by releasing thermal strain caused by the mismatch in thermal expansion coefficient between the CS materials and the Si, and by providing aspect ratio trapping of defects and dislocations.

The embodiment of FIG. 9 may not require a separate trench isolation step (shown in FIG. 7) due to the isolation provided by the patterned dielectric 810. Some of the dielectric between the CS areas can be removed by etching or an alternative process, and then these regions can be filled with materials, such as metals, that would be opaque, to provide additional optical isolation. Without departing from the scope of the invention, such trench isolation could alternatively be formed in a backend step following bonding of the photodetector substrate, or chips from the substrate to a target readout circuit Si CMOS substrate.

Figure 10:
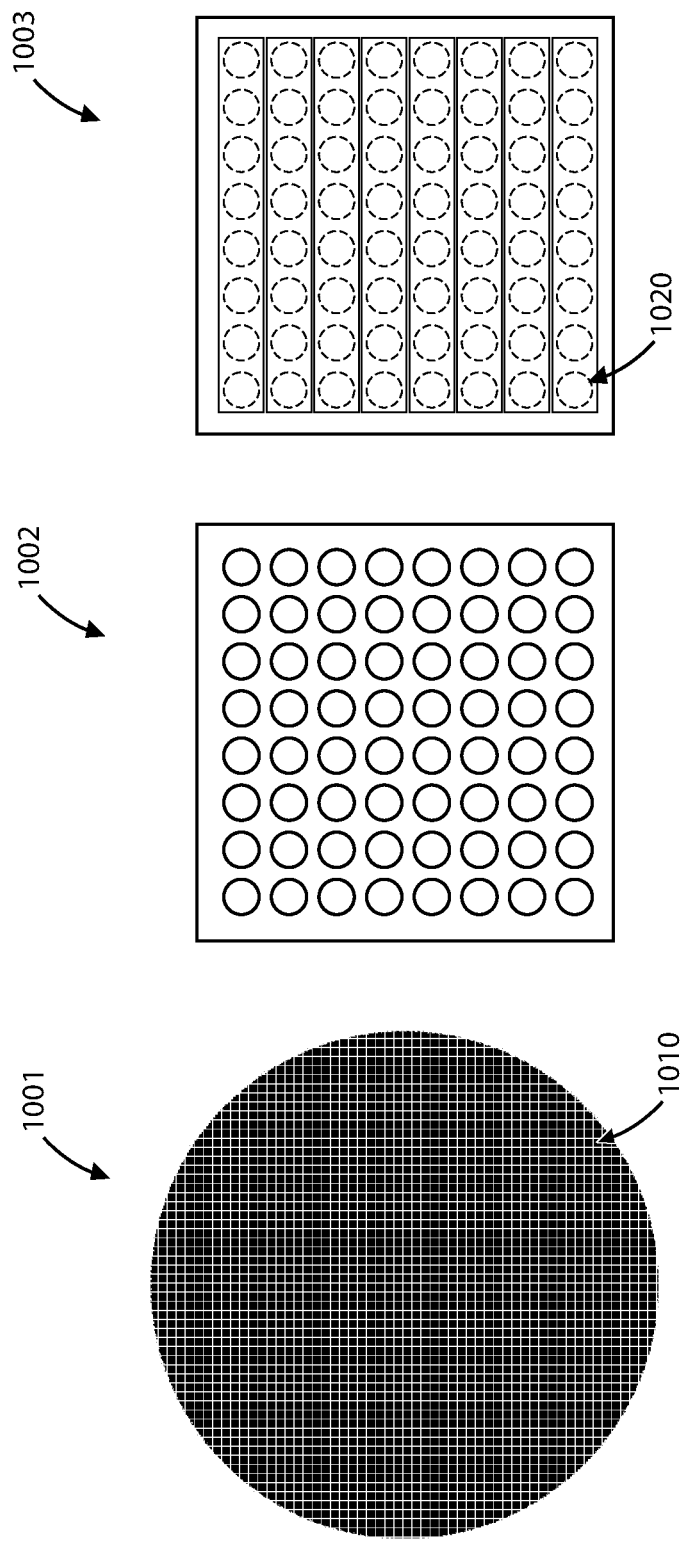
FIGS. 10A-10C are a top view description of a wafer with patterned die and top view descriptions of example dies patterned with circles or rectangular stripes for selective area heteroepitaxy, respectively, according to an example of the present invention.

FIGS. 10A-10C are simplified diagrams illustrating wafer die patterns according to various examples of the present invention. FIG. 10A illustrates a wafer 1001 with an example die pattern, where each individual die (e.g., die 1010) may vary in size/area from small, such as less than 1 mm×1 mm, to a larger size that is the maximum allowable for the lithography system used. Within each die, various patterns of the dielectric can be leveraged should selective area heteroepitaxy be utilized for CS material growth on Si. Examples can include circular patterns (shown in die 1002 of FIG. 10B), rectangular patterns (shown in die 1003 of FIG. 10C). Pattern shape and size selection can assist, along with growth optimization and pattern fill factor, to achieve higher material quality. For the rectangular stripe patterns shown in die 1003, circular photodetectors, denoted by the dashed circles (e.g., photodetector 1020), could be formed following growth by mesa etching or by diffusion, the latter of which would form a planar device. The patterns represent the area from which the dielectric, for selective area heteroepitaxy, is removed to expose the Si surface below the dielectric.

Other patterns, such as, but not limited to, squares, ovals, trapezoids, different size rectangles, parallelograms, and various polygons could be leveraged without departing from the scope of the invention.

The sequence of steps to complete the realization of such photodetectors and photodetector arrays, including those represented in the embodiments of FIG. 2-10C, can be carried out in a number of ways and in different order, and the design of the device layers and structure could be varied, without departing from the scope of the invention.

Figure 11:
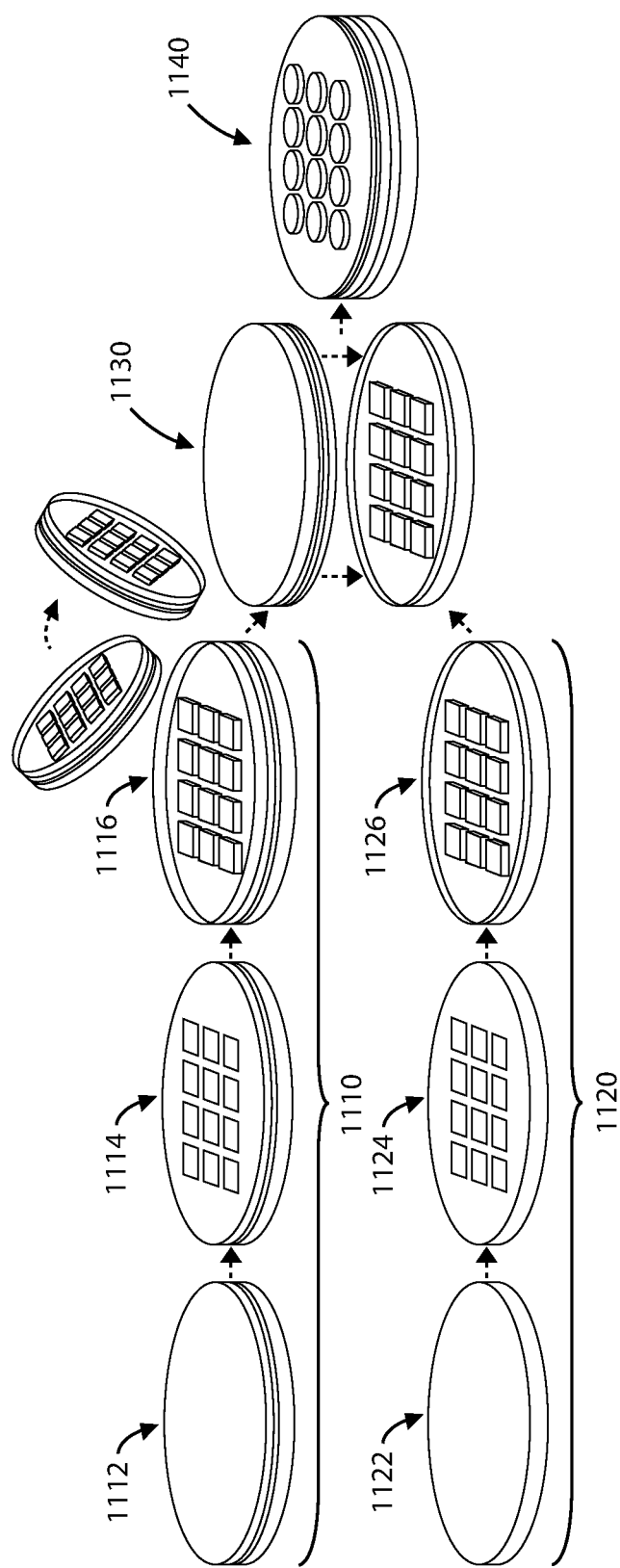
FIG. 11 is a simplified flow diagram illustrating a method to manufacture photodetectors and photodetector array circuits leveraging direct heteroepitaxy or selective area heteroepitaxy on a Si substrate, and the subsequent wafer-to-wafer bonding integration with a readout circuit wafer, followed by backside processing, according to an example of the present invention.

FIG. 11 is a simplified flow diagram illustrating a method to manufacture photodetectors and photodetector array circuits according to an example of the present invention. As shown, FIG. 11 illustrates and summarizes sequences of parallel steps that could be carried out to realize CS on Si photodetectors and photodetector arrays that are then integrated with CMOS circuits capable of functions including, but not limited to, read out, logic, AI, machine learning (ML), signal processing, and image processing. In an example, the present method includes a front-end photodetector fabrication process 1110 and a front-end CMOS IC fabrication process 1120 performed in parallel.

As shown, the front-end photodetector fabrication process 1110 can include providing a substrate 1112 (e.g., Si substrate, SOI substrate, or the like), performing CS on Si heteroepitaxy and forming device structures to produce device 1114, and performing metallization to produce device 1116. The CS on Si heteroepitaxy, device structure formation, and metallization steps can be carried out to realize structures such as, but not limited to, those described in the embodiments of FIG. 7 or FIG. 9. Other photodetector variants could also be fabricated and then follow a similar sequence of steps for integration with CMOS circuit wafers. For the front-end IC fabrication process 1120, the steps can similarly include providing a substrate 1122 (e.g., Si CMOS substrate, or the like), performing IC fabrication processes (e.g., ROIC on Si process and/or other IC front-end fabrication) to produce device 1124, and performing metallization to produce device 1126.

Following front-end fabrication of the photodetector circuits (process 1110) and the CMOS circuits (process 1120), the wafers (devices 1116 and 1126) could be bonded face-to-face (i.e., a flip-chip bonding configuration), as shown by device 1130, leveraging common bonding techniques such as, but not limited to, indium-to-indium, oxide-to-oxide, and copper-to-copper (Cu-to-Cu) bonding. The precise steps for back-end fabrication, including bonding integration, could vary depending on the photodetector structure and photodetector front-end fabrication sequence, and the CMOS device structure and CMOS front-end fabrication sequence, without departing from the scope of the invention.

Following the bonding, back-end fabrications steps may be performed to produce a processed device 1140 (e.g., device 200 of FIG. 2). Such back-end fabrication steps may include, but are not limited to: removal of the photodetector handle wafer, either partially or entirely by grinding, etching, or polishing, or a combination therein; application of backside contacts, which could be made to either the n-side or p-side of the photodetector, depending on the orientation of the photodetector structure (i.e., whether the photodetector is a PIN or PN structure from the top down, or NIP or NP structure from the top down; application of color filters; application of lenses or other optics). The device structure could be FSI or BSI and the precise steps and the order of the steps could vary without departing from the scope of the invention.

Alternatively to the wafer-to-wafer process described, the fabrication of photodetectors bonded to CMOS circuits could also be carried out in a chip-to-wafer or chip-to-chip fashion. Those of ordinary skill in the art will recognize other variations, modifications, and alternatives.

Figure 12:
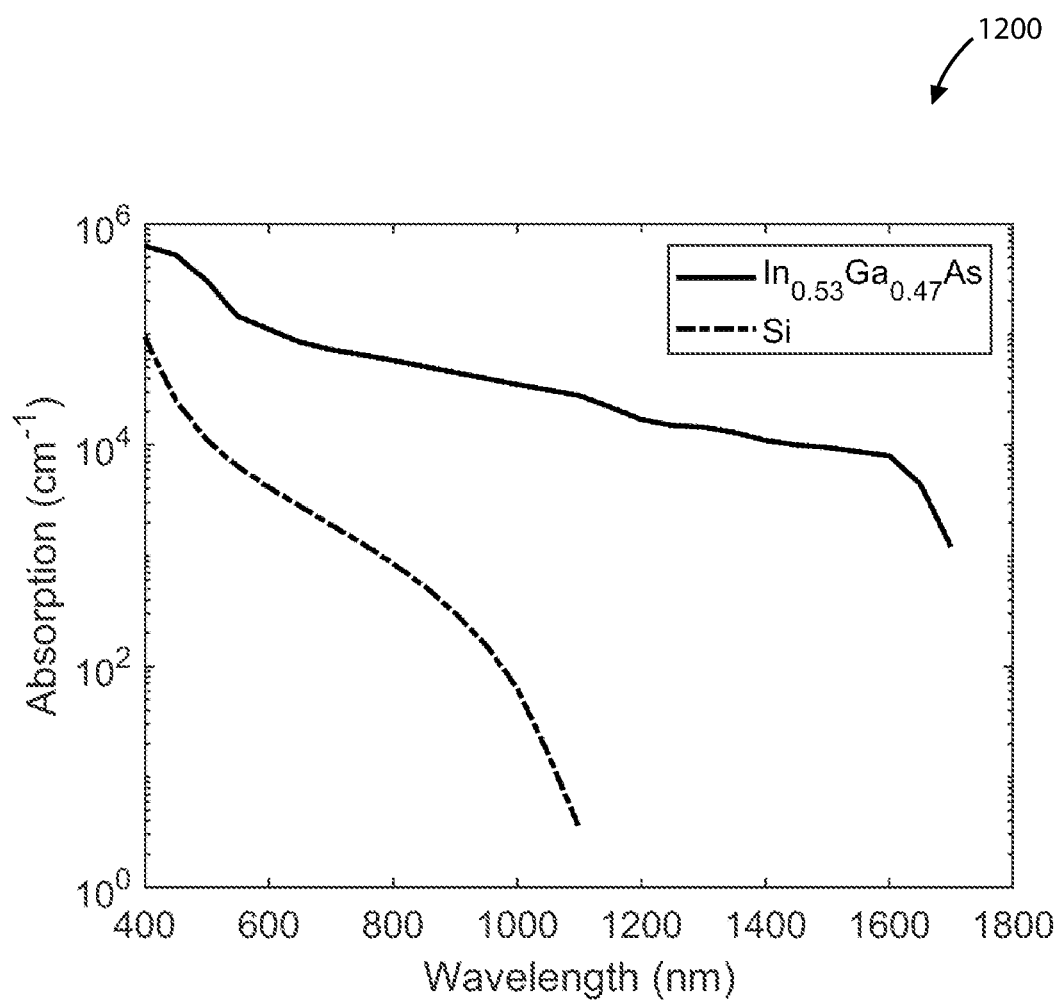
FIG. 12 is a simplified diagram illustrating a plot of the approximate absorption spectra for InGaAs material, which is used in the present invention, and Si material, which is used in conventional CMOS sensing devices.

FIG. 12 is a simplified diagram illustrating a plot 1200 of the approximate absorption spectra for InGaAs material, which is used in the present invention, and Si material, which is used in conventional CMOS sensing devices. To prove the method and device, we plotted a compilation of data for the absorption of InGaAs (solid line) and Si (dotted line) over a wide wavelength range to illustrate the benefit and advantages of the present techniques. As illustrated, the absorption of InGaAs is higher over the wavelength range considered, and the wavelength range of InGaAs extends to longer wavelength than that for Si. The spectrum illustrated for InGaAs is for an indium composition of 0.53 and a gallium composition of 0.47. This composition is commonly used as it is lattice matched to InP. The absorption wavelength range for InGaAs can be extended to other wavelength regions by altering the InGaAs composition.

FIGS. 13A to 13E are simplified diagrams illustrating a method of forming a photodetector device (devices 1301 to 1305) according to an example of the present invention. The method steps illustrated in these figures can be combined with any method steps discussed previously for forming a photodetector device. Further, the same numerals across these figures refer to the same elements, regions, configurations, etc.

Figure 13A:
FIGS. 13A-13E are simplified diagrams illustrating a method of forming a photodetector device according to an example of the present invention.
Figure 13B:
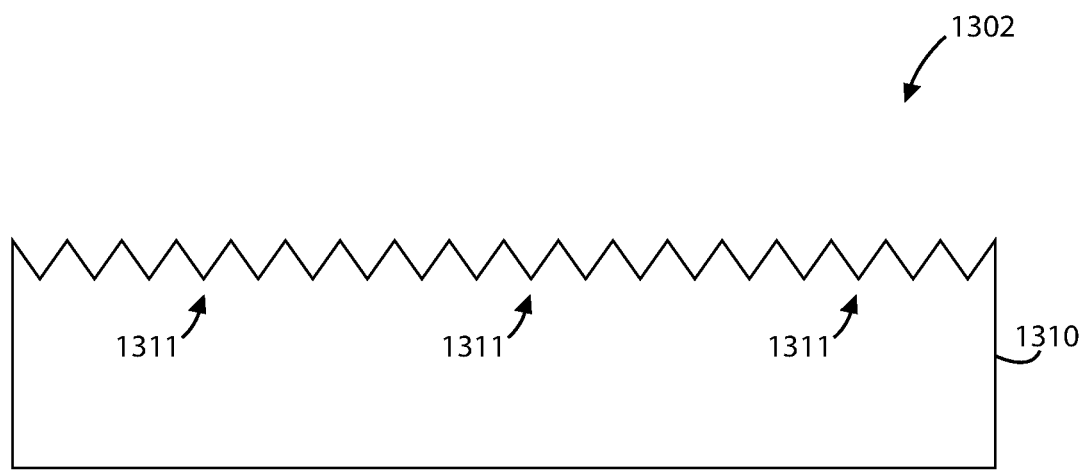

In an example, the present method begins by providing a large silicon substrate 1310, as shown in FIG. 13A. The silicon substrate 1310 has a diameter of about two inches to about twelve inches. In an example, the surface of the silicon substrate is cleaned to remove any native oxide material. The substrate is cleaned using a high temperature environment including hydrogen or other suitable species. In an example, the method includes forming a plurality of v-grooves 1311, as shown in FIG. 13B, each of which can have a feature size of 30 to 500 nanometers in width. In an example, each of the v-grooves exposes {111} crystalline planes of the silicon substrate. The plurality of grooves 1311 are commonly formed using an etchant such as potassium hydroxide (KOH) and tetramethyl ammonium hydroxide (TMAH), or other suitable etchants.

Figure 13C:
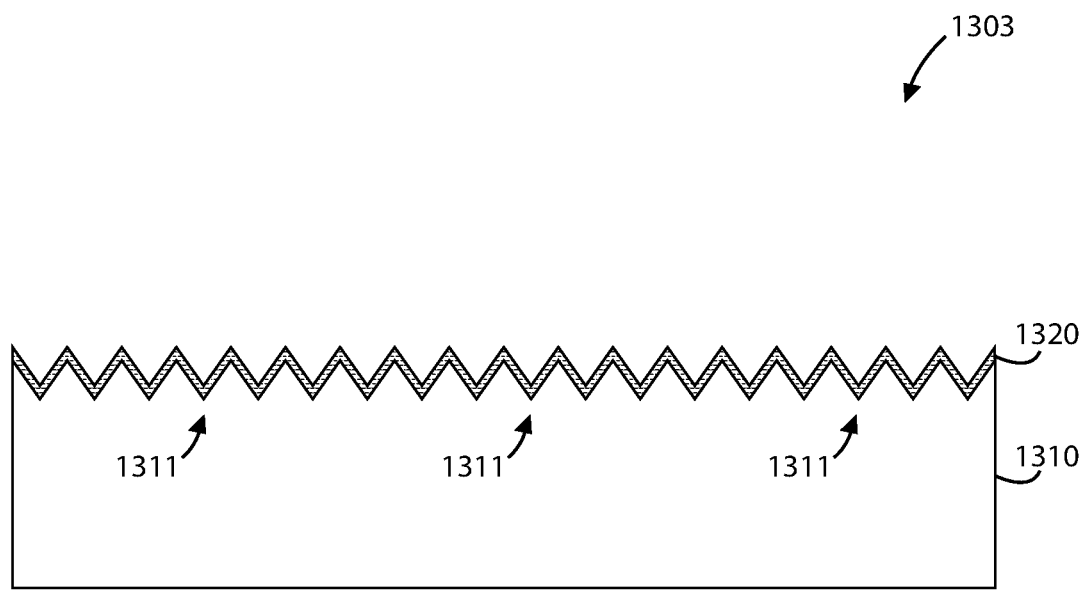

In an example, the method includes forming a nucleation layer 1320 comprising a gallium arsenide material to coat a surface region of the silicon substrate 1310, as shown in FIG. 13C. The nucleation layer 1320 has a thickness ranging from 10 nm to 100 nm, but can be others.

Figure 13D:
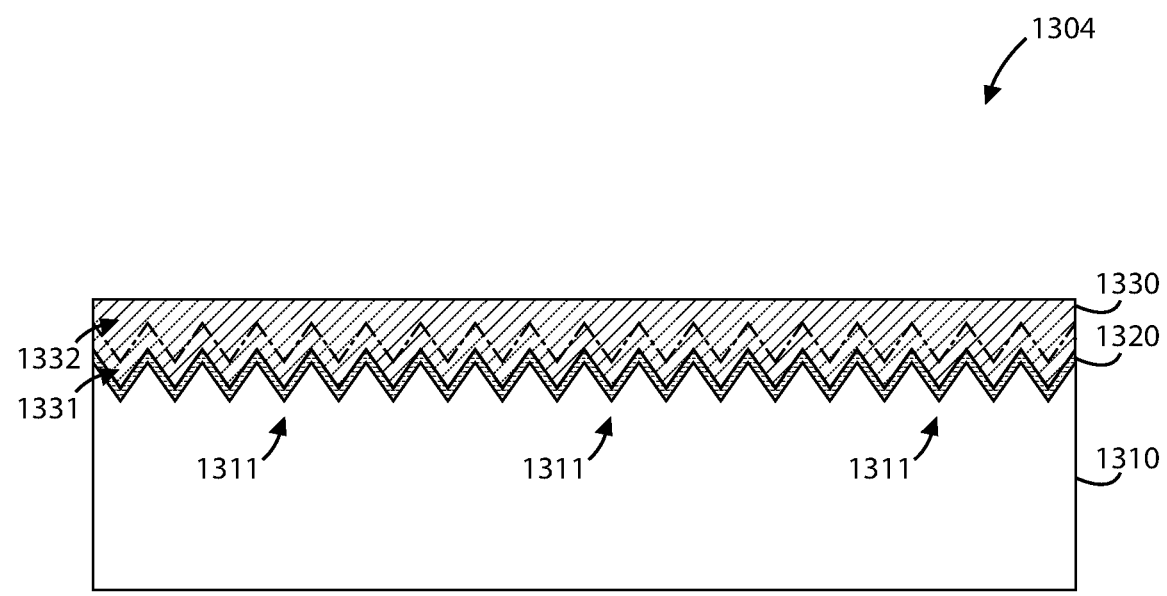

In an example, the method includes forming a buffer material 1330 comprising a plurality of nanowires formed overlying each of the plurality of grooves and extending along a length of each of the v-grooves, as shown in FIG. 13D. The buffer material 1330 includes a first transitionary region 1331 extending from each of the plurality of nanowires, and a second transitionary region 1332 characterized by a {100}-oriented crystalline planar growth of a gallium arsenide compound semiconductor (CS) material configured using a direct heteroepitaxy such that the CS material is characterized by a first bandgap characteristic, a first thermal characteristic, a first polarity, and a first crystalline characteristic, and the silicon substrate 1310 is characterized by a second bandgap characteristic, a second thermal characteristic, a second polarity, and a second crystalline characteristic.

In an example, the buffer material further comprises a gallium arsenide containing material and an indium phosphide containing transitionary region (e.g., InGaAs, or the like) and an interface region comprising a trapping layer comprising indium gallium arsenide and indium phosphide overlying the gallium arsenide containing material and indium phosphide containing transitionary region. In a specific example, the transitionary region can be closer to GaAs at the start and can be closer to InP towards an InP graded region.

Figure 13E:
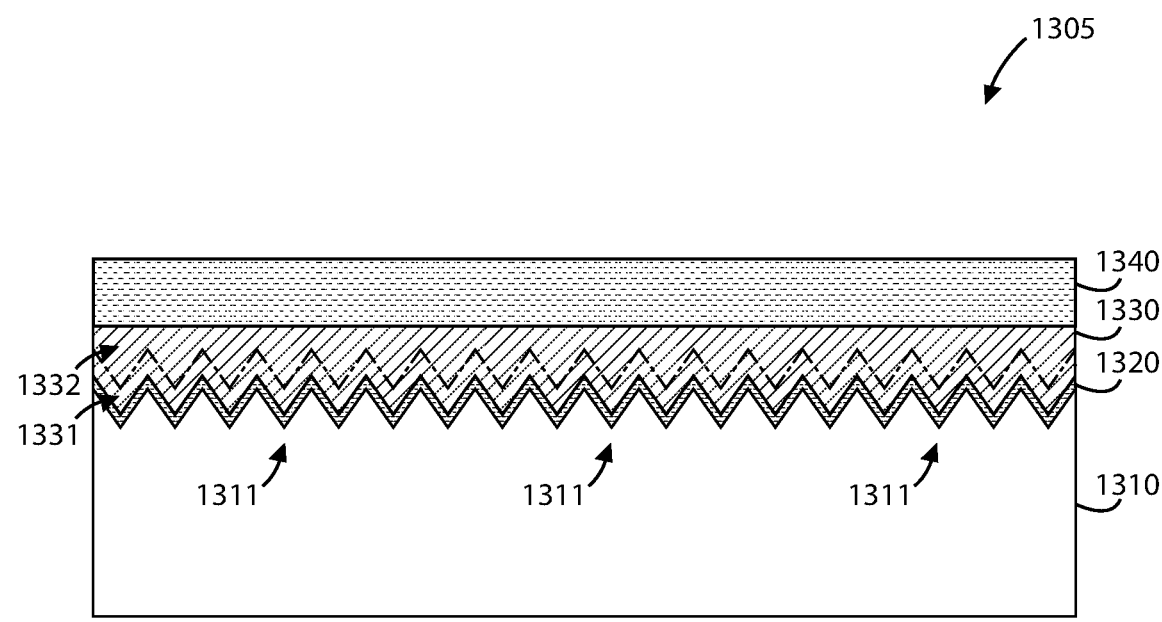

In an example, the method also includes forming one or more device material layers overlying the buffer material 1330, such as a n-type material layer 1340 shown in FIG. 13E. The device materials can include photodetector device materials, such as those discussed previously. As such, these method steps for forming the v-groove patterned substrate can be combined with any method steps for optoelectronic and sensor devices discussed herein.

According to an example, the present invention provides for a method of fabricating a sensor device using a selectively transparent wavelength configuring material. Depending on the material composition and configuration of this selectively transparent material, the sensor device can exhibit high performance for target wavelength ranges while maintaining low dislocation density. Further details are provided with respect to the following figures.

Figure 14:
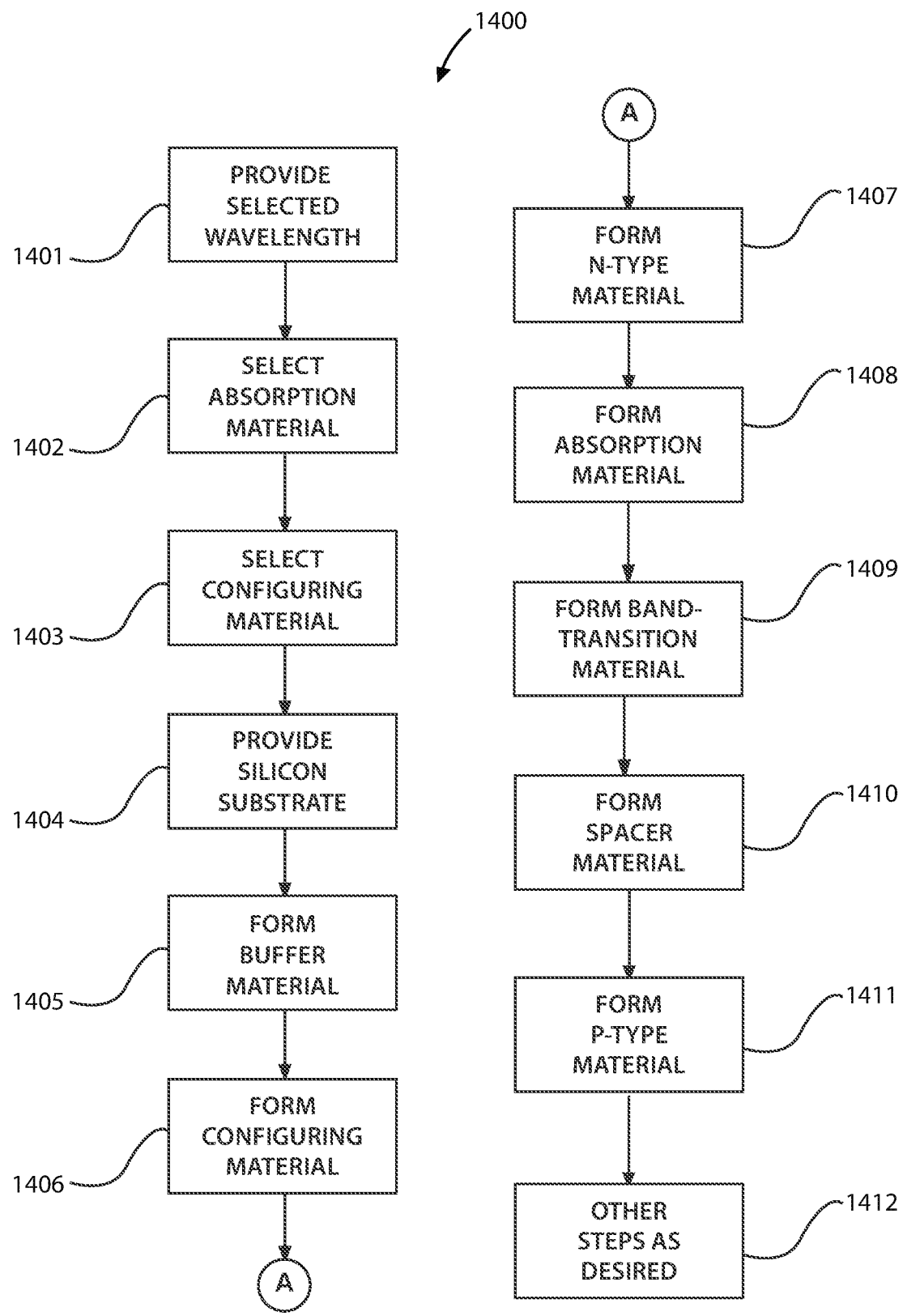
FIG. 14 is a simplified flow diagram illustrating a method of fabricating a sensor device using a wavelength configuring material according to an example of the present invention.

FIG. 14 is a simplified flow diagram illustrating this method 1400 of fabrication, which can be briefly described by the following steps:

1401. Provide a selected wavelength range;
1402. Select absorption material and composition;
1403. Select a wavelength configuring material for the selected wavelength range;
1404. Provide a silicon (Si) substrate;
1405. Form a buffer material overlying the substrate;
1406. Form a wavelength configuring material overlying the buffer material;
1407. Form an n-type material overlying the wavelength configuring material;
1408. Form an absorption material overlying the n-type material;
1409. Form one or more band transition materials overlying the absorption material;
1410. Form a spacer material overlying the band transition material;
1411. Form a p-type material overlying the spacer material;
1412. Perform other steps, as desired.

For steps 1401 to 1403, the method includes providing a selected wavelength spectrum/range, selecting an absorption material and composition, and selecting a wavelength configuring material for the selected wavelength range, respectively. The wavelength range can be determined based on the target application. Such applications may include optical sensors, optical fiber communications, LiDAR functionality, and others. In a specific example, the selected wavelength ranges from about 900 nm to 1700 nm.

The absorption material and the wavelength configuring material are then selected based on the target wavelength range. As discussed previously, the absorption material and the wavelength configuring material can include InP, InGaAs, GaAs, GaP, InGaAsP, InAs, InAlAs, InAlGaAs, InGaP, or other similar materials. The absorption material can have varying compositions depending on desired characteristics or performance. For example, the absorption material can include $In_xGa_{1-x}As$ ($0<x\leq1$), or $In_yGa_{1-y}As_zP_{1-z}$ ($0<y\leq1$, $0<z\leq1$), or $In_xGa_yAl_{1-x-y}As$ ($0<x\leq1$, $0<y<1$). The choice of the wavelength configuring material can also depend on the chosen absorption material (e.g., InGaAs, InAlAs, or InGaP wavelength configuring material to coordinate with InGaAs, InAlGaAs, or InGaAsP absorption materials with target compositions. With various combinations of these materials, lower dislocation density can be achieved.

For step 1404, the method includes providing an Si substrate, which can include a frontside surface region and a backside surface region. This substrate can be configured similarly to the substrates discussed previously (e.g., plurality of v-grooves, crystalline structure, etching processes, etc.).

For step 1405, the method includes forming a buffer material overlying the frontside surface region of the substrate. In a specific example, the buffer material is a gallium arsenide buffer material that forms a gallium arsenide buffer region overlying the frontside surface region of the substrate. The buffer material can also be configured similarly to the buffer materials discussed previously (e.g., direct heteroepitaxy, CS material, crystalline structure, etc.).

For step 1406, the method includes forming the wavelength configuring material overlying the buffer material. Depending on the composition and configuration, this wavelength configuring material can be calibrated to allow certain wavelengths to pass through or this material can be configured to be non-transparent. In an example, the wavelength configuring material includes a transparent region, which includes a plurality of material regions. These material regions can include different elemental concentrations of certain materials or combinations of materials.

In an example, the transparent region is configured with a non-absorption property with respect to the selected wavelength. This non-absorption property can include non-absorption of electromagnetic radiation in the selected wavelength, non-reflection of electromagnetic radiation in the selected wavelength, non-scattering of electromagnetic radiation in the selected wavelength, or the like. The transparent region can be characterized by a resulting absorption of electromagnetic radiation that is a remaining portion of electromagnetic radiation after transmission of electromagnetic radiation in the selected wavelength.

The plurality of material regions can have at least a first material composition and a second material composition. For example, the first material composition can include an InGaP material, an InP strained layer superlattice (SLS) material, or an InGaP SLS material. The second material includes an InP spacer material, a GaAs spacer material, or other similar spacer material. In other cases, these material regions can include varying elemental concentrations of InP, InGaAs, GaAs, GaP, InGaAsP, InAs, InAlAs, InAlGaAs, InGaP, or the like.

Also, the concentrations of the material regions can be configured in an alternating pattern, a continuous pattern, a step-wise pattern, or the like and combinations thereof. In a specific example, the plurality of material regions is formed using a trimethylindium (TMIn) source, a trimethylaluminium (TMAl) source, a trimethylgallium (TMGa) source, a triethylgallium (TEGa) source, an arsine ($AsH_3$) or an alternative tertiarybutylarsine (TBA), a phosphine ($PH_3$) source or an alternative tertiarybutylphosphine (TBP) source, or the like. Further details of the concentrations are discussed below with respect to FIGS. 15A-15D.

Alternatively, the wavelength configuring material includes a graded region, which includes a plurality of material regions. These material regions can include different elemental concentrations of certain materials or combinations of materials. The plurality of material regions can have varying elemental concentrations ranging from a first material composition to a second material composition or have varying elemental concentrations for a single material composition. For example, these regions can have differing concentrations of InAlAs or InGaAs or InGaP, and the lattice constants of these regions can be graded from either of those compounds to InP. In another example, the concentrations can range from InGaAs to InGaAsP, or InAlAs to InAlGaAs. In other cases, the material regions can include varying elemental concentrations of InP, InGaAs, GaAs, GaP, InGaAsP, InAs, InAlAs, InAlGaAs, InGaP, or the like.

The plurality of material regions can have varying elemental concentrations ranging from a first material composition to a second material composition or have varying elemental concentrations for a single material composition. For example, these regions can have differing concentrations of InAlAs or InGaAs or InGaP, and the lattice constants of these regions can be graded from either of those compounds to InP. In another example, the concentrations can range from InGaAs to InGaAsP, or InAlAs to InAlGaAs. In other cases, the material regions can include varying elemental concentrations of InP, InGaAs, GaAs, GaP, InGaAsP, InAs, InAlAs, InAlGaAs, InGaP, or the like.

Also, the concentrations of the material regions can be configured in a continuous pattern, a step-wise pattern, or the like and combinations thereof. The concentrations of different elements can also be configured in an increasing order, a decreasing order, a repeating order, or other order. In a specific example, the plurality of material regions is formed using a trimethylindium (TMIn) source, a trimethylgallium (TMGa) source, an arsine ($AsH_3$) or a phosphine ($PH_3$) source, a tertiarybutylarsine (TBA), a tertiarybutylphosphine (TBP) source, or the like. Further details of the concentrations are discussed below with respect to FIGS. 16A and 16B.

Each of the material regions can have an interface region between an adjacent pair of the material regions. These interface regions can be fixed for a temperature range of about 600 degrees Celsius to about 700 degrees Celsius. These interface regions can also be substantially free from a smearing of compositions (i.e., uneven or irregular composition boundaries) between a pair of adjacent material regions defining the interface regions. Further, the resulting device can be characterized by a quantum efficiency ranging from about 50% to 100%.

In an example, the transparent region or the graded region can also be strained at different levels depending on the selected wavelength. In an example, the final material region (i.e., topmost region) is relaxed and free from strain. The final material region can also be lattice matched to the next material region formed overlying (e.g., n-type contact region of photodetector device). Further, the sensor device materials on top of the transparent region can be lattice matched.

For step 1407, the method includes forming an n-type material overlying the wavelength configuring material. In a specific example, this material can form an n-type contact region and includes an InP, InGaP, InGaAsP, InAlGaAs or InAlAs material. The n-type material can also be lattice matched to the final material layer of the underlying transparent region or graded region. The n-type material can also be configured similarly to the n-type materials discussed previously (e.g., direct heteroepitaxy, CS material, impurity concentration, etc.).

For step 1408, the method includes forming an absorption material overlying the n-type material. In a specific example, this material is an unintentionally doped (UID) InGaAs absorption material that forms a UID InGaAs absorber region overlying the n-type material. The absorption material can also be configured similarly to the absorption materials discussed previously (e.g., direct heteroepitaxy, CS material, impurity concentration, etc.).

For step 1409, the method includes forming one or more band transition materials overlying the absorption material. The band transition material can include a CS material deposited using direct heteroepitaxy. In an example, the band transition material can include InP, InGaAsP, InAlAs, InAlGaAs, or the like. Also, the band transition material can include similar impurity concentrations as discussed previously for CS materials.

For step 1410, the method includes forming a spacer material overlying the band transition material. This spacer material can include a p-type spacer material or a non-absorbing p-type cladding material. In a specific example, this material is a UID spacer material that forms a UID spacer region overlying the band transition material. The spacer material can include a CS material deposited using direct heteroepitaxy. In an example, the spacer material can include InP, InGaAs, InGaAsP, InAlAs, InAlGaAs, or the like. Also, the spacer material can include similar impurity concentrations as discussed previously for CS materials.

For step 1411, the method includes forming a p-type material overlying the spacer material. In a specific example, the p-type material is formed within a portion of the spacer material and the topmost region of the p-type material can form the p-type contact region. This p-type material can also be configured similarly to the p-type materials discussed previously (e.g., direct heteroepitaxy, CS material, impurity concentration, etc.).

In an example, the n-type material, the absorption material, the one or more band transition materials, the spacer material, and the p-type material form a device structure. The device structure can be configured as a mesa-type sensor device in which at least the buffer material (e.g., GaAs buffer region), the wavelength configuring material, the n-type contact region, the absorption material (e.g., UID InGaAs absorber region), the one or more band transition materials (e.g., UID InGaAsP or InAlGaAs band transition regions), the p-type spacer material, and the p-type contact region are grown in-situ.

In an example, the device structure can be configured as a planar-type sensor device in which at least the one or more band transition materials, the spacer material, and the p-type contact material are formed undoped. In this case, the method can include forming one or more diffusion (e.g., Zn dopant) p-type regions within one or more portions of the p-type contact region, which can also include one or more portions of the p-type spacer material.

Depending on the application, the transparent region of the device structure can be configured to allow electromagnetic radiation to pass through in the selected wavelength onto the device structure (e.g., a photodetector) from a backside illumination configuration or a topside illumination configuration.

For the backside illumination configuration, the method can further include removing one or more portions of the silicon substrate to form a backside illumination region configured to allow one or more photons to interact with the wavelength configuring material and be absorbed by a portion of the absorption material (e.g., UID InGaAs absorber region). The method can further include removing one or more portions of the buffer material (e.g., GaAs buffer region) to form the backside illumination region. Further, the method can include forming an n-metal contact overlying a portion of the n-type contact material and a p-metal contact overlying a portion of the p-type contact material.

For the topside illumination configuration, the method can further include forming a topside illumination region within at least a portion of the p-type contact region. The topside illumination region can be configured to allow a plurality of photons to be absorbed by a portion of the absorption material (e.g., UID InGaAs absorber region). The removal processes for both configurations can include an etching process, a thinning process, or the like. An n-metal contact and a p-metal contact can also be formed overlying portions of the n-type contact material and p-type contact material. In a specific example, the p-metal contact can have a cavity region around the periphery of the sensor device to expose the topside illumination region. Further details of these configurations are discussed with respect to FIGS. 17A-17B and FIGS. 18A-18B.

The above sequence of steps is used to form a sensor device using a selectively transparent wavelength configuring material or a graded wavelength configuring material according to one or more embodiments of the present invention. Depending on the embodiment, one or more of these steps can be combined, or removed, or other steps may be added (step 1412) without departing from the scope of the claims herein. One of ordinary skill in the art will recognize other variations, modifications, and alternatives. Further details of this method are provided throughout the present specification and more particularly below.

FIGS. 15A-15D are simplified diagrams illustrating a method of forming a sensor material (e.g., photosensor, photodetector, etc.) with a selectively transparent buffer according to an example of the present invention. The method steps illustrated in these figures can be combined with any method steps discussed previously for forming a photodetector device. Further, the same numerals across these figures refer to the same elements, regions, configurations, etc.

Figure 15A:
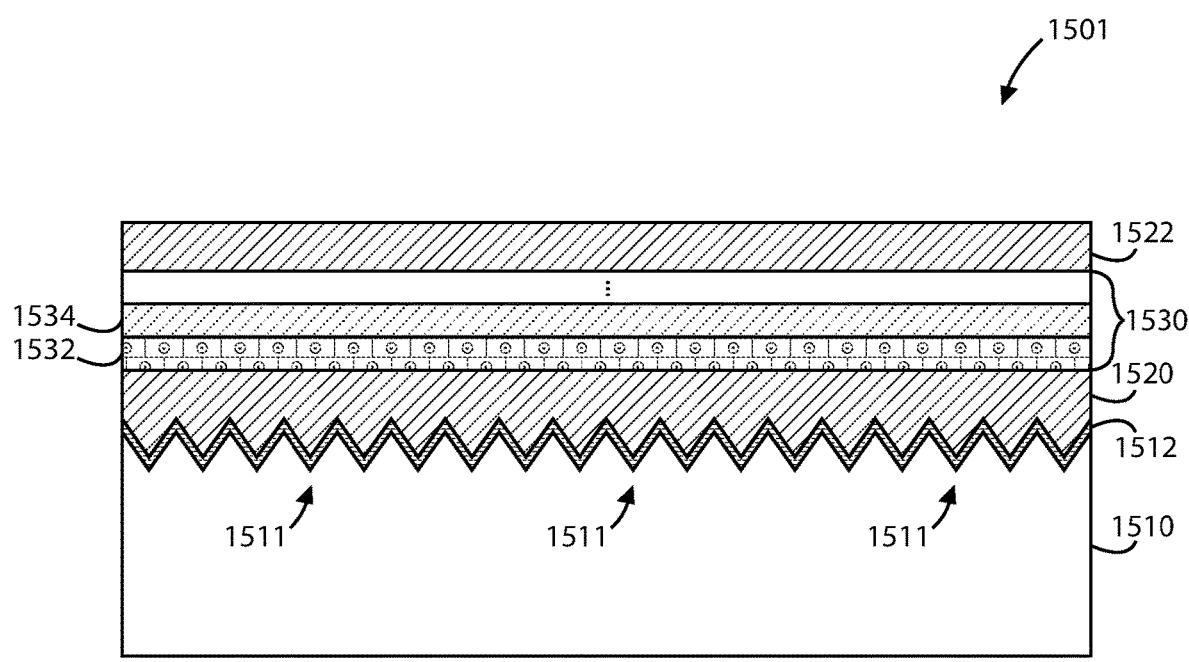
FIGS. 15A-15D are simplified diagrams illustrating a method of forming a sensor material with a selectively transparent buffer according to an example of the present invention.

The method can begin with similar steps to those shown in FIGS. 13A-13D forming the materials of the sensor device 1304 prior to the device layers. Similar to device 1304, FIG. 15A shows device 1501 having a silicon substrate 1510 with a plurality of v-grooves 1511, a nucleation layer 1512 formed overlying the v-grooves 1511, and a first buffer material 1520 formed overlying the v-grooves 1511. The configuration and composition of these materials can be similar to those discussed previously.

As previously discussed, the method also includes forming a transparent buffer region or transparent material stacks. The transparent buffer region can include a plurality of material regions having at least a first material composition and a second material composition, which can be configured as a defect filter layer (DFL) or defect material stack. In a specific example, the first material composition can include an InGaAs (P)/GaAs, (In) GaAsP/GaAs, InAlAs/GaAs or InGaP/GaAs strained layer superlattice (SLS) material; or an InGaAs (P), (In) GaAsP, InAlAs, or InGaP strained interlayer (SIL) material, while the second material composition includes a GaAs spacer material. Or, the first material composition can include an InGa (As) P/InP, In (Ga) AsP/ InP, or InAlAs/InP SLS material; or an InGa (As) P, In (Ga) AsP or InAlAs SIL material; while the second material includes an InP spacer material, or the like. In other cases, these material regions can include varying elemental concentrations of InP, InGaAs, GaAs, GaP, InGaAsP, InAs, InAlAs, InAlGaAs, InGaP, or the like.

As shown in device 1501, the transparent buffer region includes a first defect filter layer (DFL) 1530 formed overlying the first buffer material 1520. In an example, the defect filter material stacks 1530 includes one or more defect filter regions 1532 (i.e., first material composition) overlying the buffer material 1520. The defect filter material 1530 can also include one or more spacer regions 1534 (i.e., second material composition) overlying the buffer material 1520. These defect filter regions 1532 and spacer regions 1534 can be configured in an alternating pattern (e.g., repeating 3×, 5×, 10×, etc.). A defect filter cap material or a second buffer material 1522 can be formed overlying the one or more defect filter regions 1532 and the one or more spacer regions 1534 as well. These regions may be formed following one or more thermal cycle annealing (TCA) processes on the first buffer material 1520.

Figure 15B:
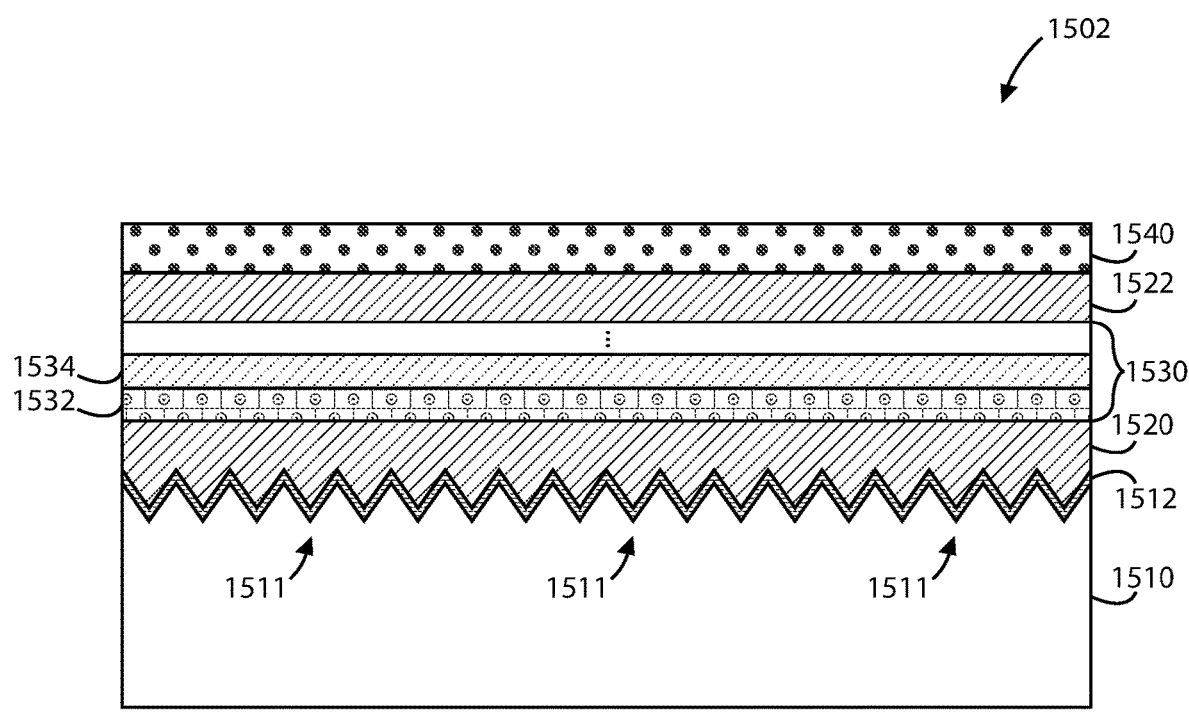

As shown in FIG. 15B, the method can include forming additional transparent buffer regions, which can be lattice matched to any device layers grown on top. Here, the method includes forming a second transparent buffer region having at least a first additional buffer material 1540 overlying the first transparent buffer region. In a specific example, the different material compositions may be chosen for each transparent buffer region. For example, the first transparent buffer region can be configured as a transparent GaAs buffer, while the second transparent buffer region can be configured as a transparent InP buffer.

Figure 15C:
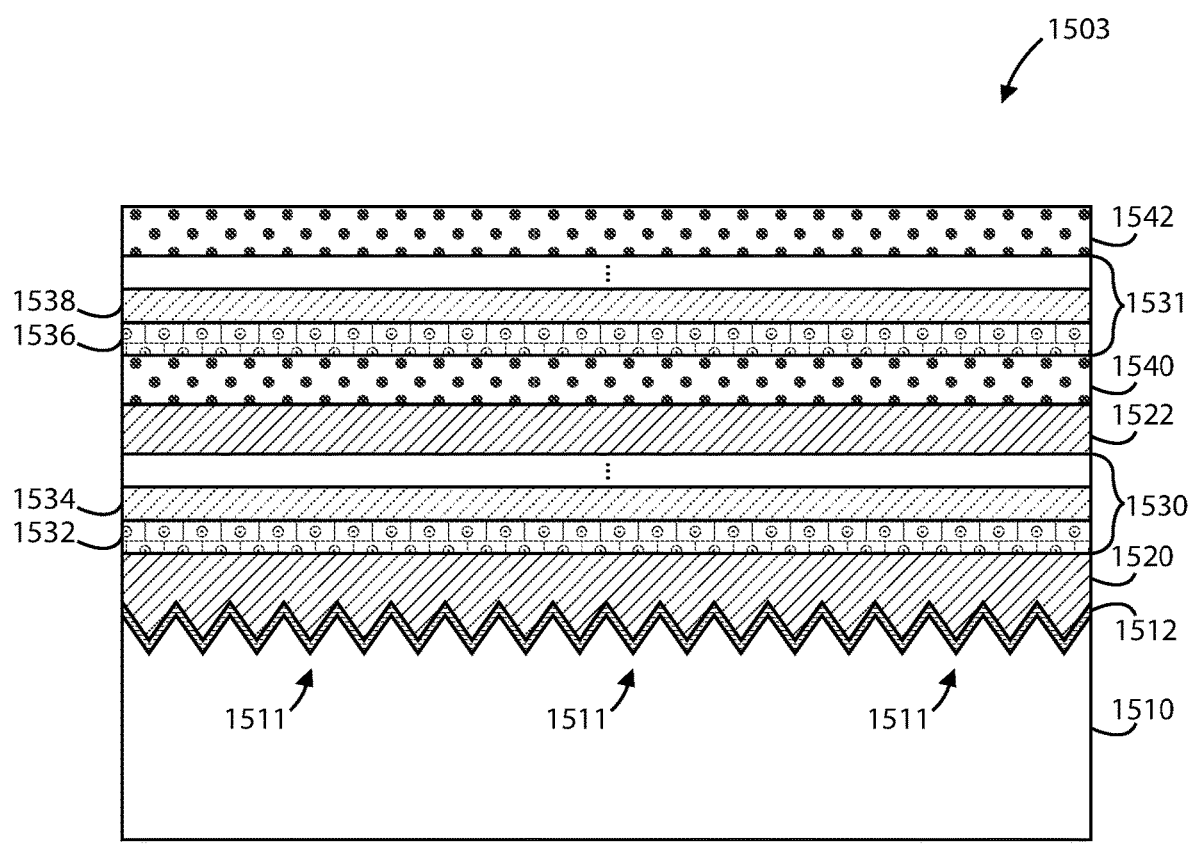

As shown in FIG. 15C, the method can include optionally forming a second DFL 1531 overlying the first additional buffer material 1540. This second DFL 1531 also includes one or more first material compositions 1536 and one or more second material compositions 1538, which can differ from the material compositions of the first transparent buffer region. Following the previous example, the first material of the second DFL 1531 can include an InGa (As) P or InAlAs SIL material, or an InGa (As) P/InP or InAlAs/InP SLS material, and the second material includes an InP spacer material, or the like. Depending on the embodiment, the materials for the first DFL 1530 and the second DFL 1531 may have the same or different configuration of materials and material compositions. Further, a second additional buffer material 1542 can then be formed overlying the second DFL 1531.

Figure 15D:
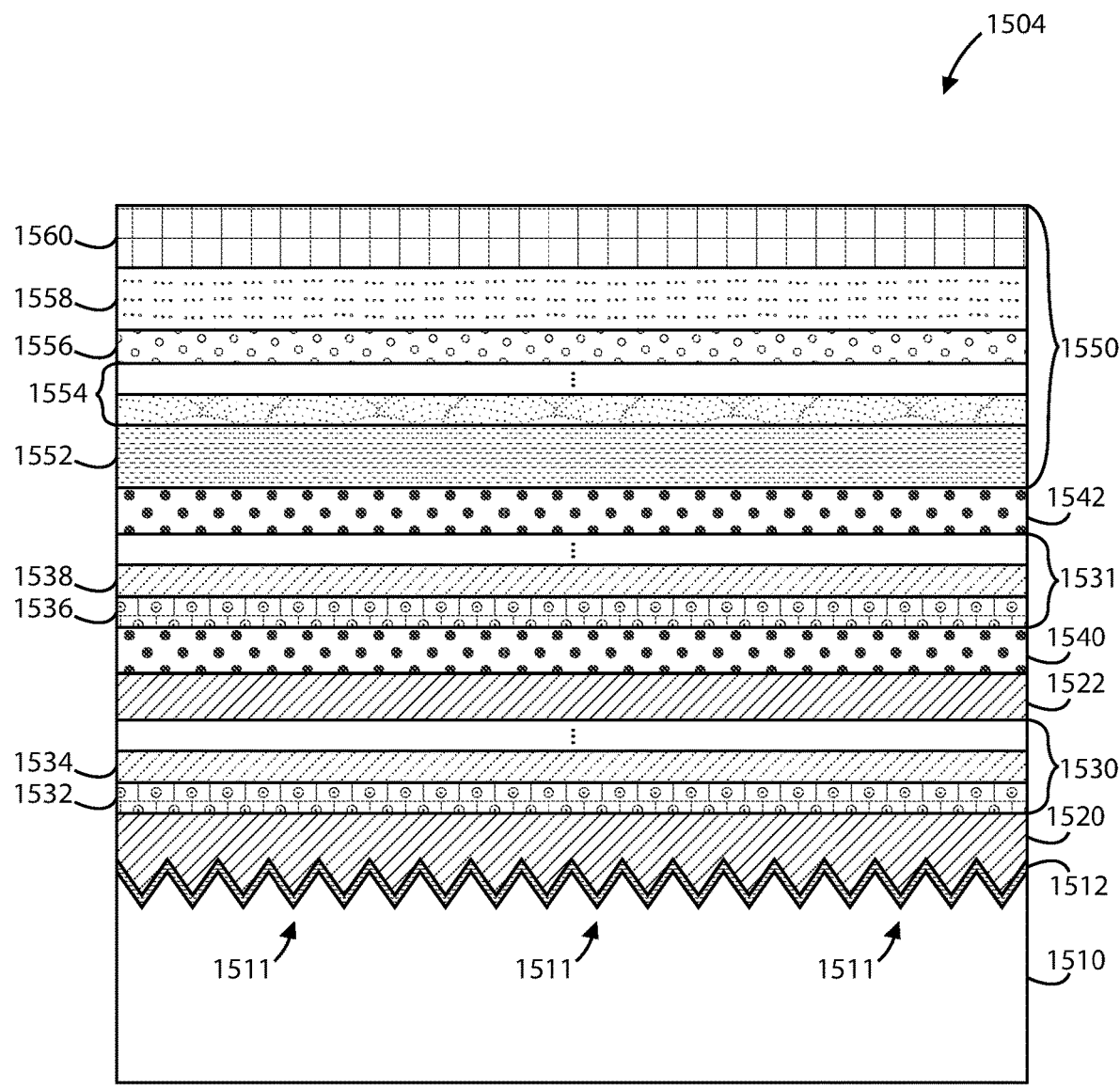

As shown in FIG. 15D, device layers 1550 can be formed overlying the one or more transparent buffer regions. Here, the device layers include, from bottom to top, an n-type contact region 1552, one or more band transition regions 1554, an absorption region 1556, a p-type spacer region 1558, and a p-type contact region 1560 These device layers can be lattice matched to the underlying buffer material (e.g., second additional buffer material 1542), which can help avoid generation of extra defects, among other benefits. In a specific example, the transparent buffer has a thickness greater than 1000 nm and is configured for an operation wavelength range of about 900 nm to about 1700 nm. The composition and configuration of the device layers can include those discussed previously.

Figure 16A:
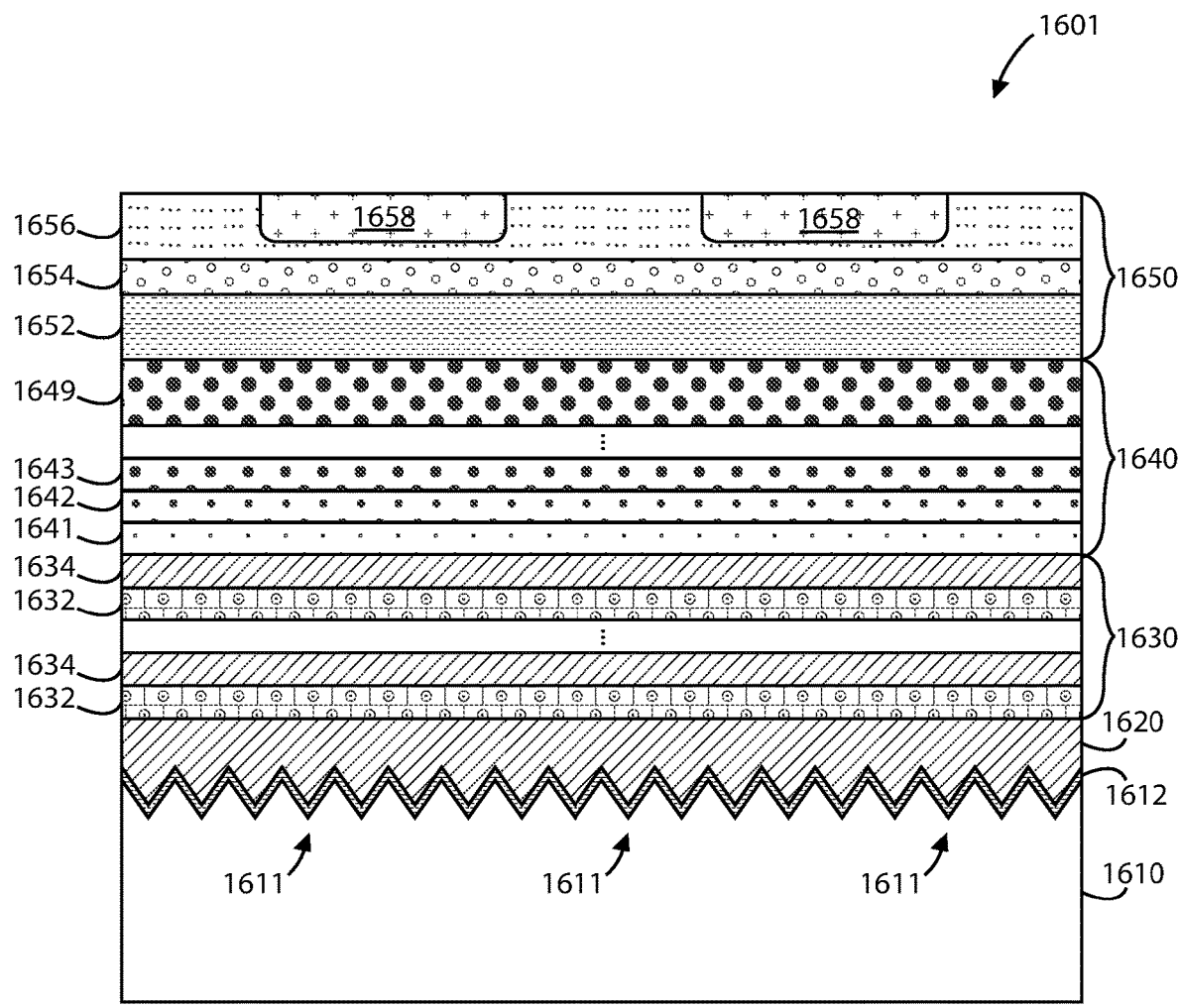
FIGS. 16A and 16B are simplified diagrams illustrating cross-sectional views of a sensor device using graded wavelength configuring materials according to examples of the present invention.
Figure 16B:
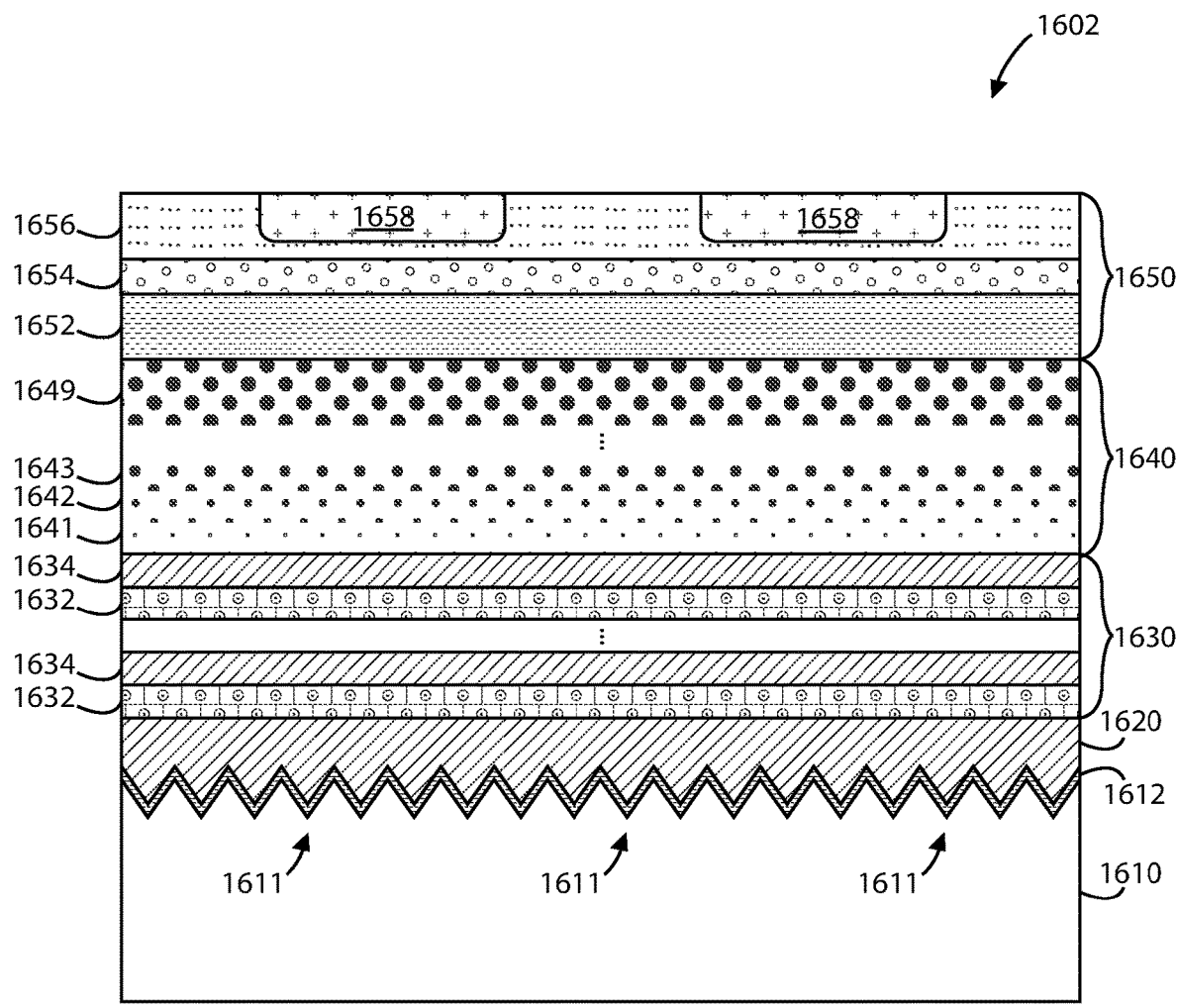

FIGS. 16A to 16B are simplified diagrams illustrating a method of forming sensor devices (devices 1601 to 1602) using graded wavelength configuring materials according to examples of the present invention. The elements and techniques illustrated in these figures can be configured similarly to or combined with any previous device elements and method steps. Further, the same numerals across these figures refer to the same elements, regions, configurations, etc.

FIG. 16A is a simplified diagram illustrating a sensor device using wavelength configuring material in a step-wise pattern according to an example of the present invention. As shown, device 1601 is a photosensor or photodetector device using a wavelength configuring material configured for a selected wavelength range, as discussed in method 1400 of FIG. 14. This device 1601 includes a patterned substrate 1610 with a plurality of v-grooves 1611 and a nucleation material 1612 (see FIGS. 13A to 13E), a buffer material 1620 overlying the substrate 1610 and the nucleation material 1612, a defect filter layer (DFL) or defect filter material stacks 1630 overlying the buffer material 1620, a wavelength configuring material 1640 overlying the defect filter material 1630, and device materials 1650 overlying the wavelength configuring material.

In an example, the defect filter material stacks 1630 includes one or more defect filter regions 1632 overlying the buffer material 1620. The defect filter material 1630 can also include one or more spacer regions 1634 overlying the buffer material 1620. These defect filter regions 1632 and spacer regions 1634 can be configured in an alternating pattern. A defect filter cap material can be formed overlying the one or more defect filter regions 1632 and the one or more spacer regions 1634 as well. These regions may be formed following one or more thermal cycle annealing (TCA) processes on the buffer material 1620. In a specific example, the defect filter material 1632 includes an InGaAs material, the spacer region 1634 includes a GaAs material, and the defect filter cap material includes a GaAs material. Other CS materials may be used as well.

In an example, the wavelength configuring material 1640 includes a graded region, which includes a plurality of material regions 1641-1649. Although the device 1601 shows material regions 1641-1643 and a final material region 1649, the number of material regions can vary depending on the desired application. These material regions can include different elemental concentrations of certain materials or combinations of materials, as discussed for FIG. 14. In a specific example, these interfaces between each adjacent pair of material regions can be free from a smearing of compositions. Further, the overlying device materials 1650 can include an n-type material 1652, an absorption material 1654, a spacer material 1656, and a p-type material 1658.

In an example, the plurality of material regions includes varying concentrations of InGaAs with a final material region of InGaAsP. The In concentration can be in increasing order, the Ga concentration can be in decreasing order, and the As concentration can remain constant. In these cases, the n-type material can be an N+ InGaAsP contact region or an N+InGaAs contact region, the absorption material can be a UID InGaAs absorber region, and the spacer material can be a UID InGaAsP spacer region.

In an example, the plurality of material regions includes varying concentrations of InAlAs with a final material region of InAlAs. The In concentration can be in increasing order, the Al concentration can be in decreasing order, and the As concentration can remain constant. Similar to the previous example, the n-type material can be an N+ InGaAsP contact region or an N+ InAlAs contact region, the absorption material can be a UID InGaAs absorber region, and the spacer material can be a UID InGaAsP spacer region or a UID InAlAs spacer region.

In an example, the plurality of material regions includes varying concentrations of InGaAsP with a final material region of InGaAsP. The In concentration can remain constant, the Ga concentration can also remain constant, the As concentration can be in increasing order, and the P concentration can be in decreasing order. Similar to the previous examples, the n-type material can be an N+ InGaAsP contact region, the absorption material can be a UID InGaAs absorber region, and the spacer material can be a UID InGaAsP spacer region.

In cases of increasing or decreasing elemental concentration, the rate increase or decrease can also be varied depending on the desired wavelength range. Also, in the cases of constant elemental concentrations, the ratio of one elemental concentration to another elemental concentration can also be varied depending on the desired wavelength range. Of course, there can be other variations, modifications, and alternatives.

FIG. 16B is a simplified diagram illustrating a sensor device using a wavelength configuring material in a continuous pattern according to an example of the present invention. As shown, the material components of device 1602 are the same as the previous device 1601. In this case, the wavelength configuring material 1640 is configured in a continuous pattern. Those of ordinary skill in the art will recognize other variations, modifications, and alternatives to the application of the wavelength configuring material.

In an example, the device layers can be configured as mesa-type sensor devices, planar-type sensor devices, or the like. Further, the device on the transparent buffer can be configured for either front-illumination or back-illumination configurations. Examples of these configurations are shown in FIGS. 17A and 17B and FIGS. 18A and 18B.

Figure 17A:
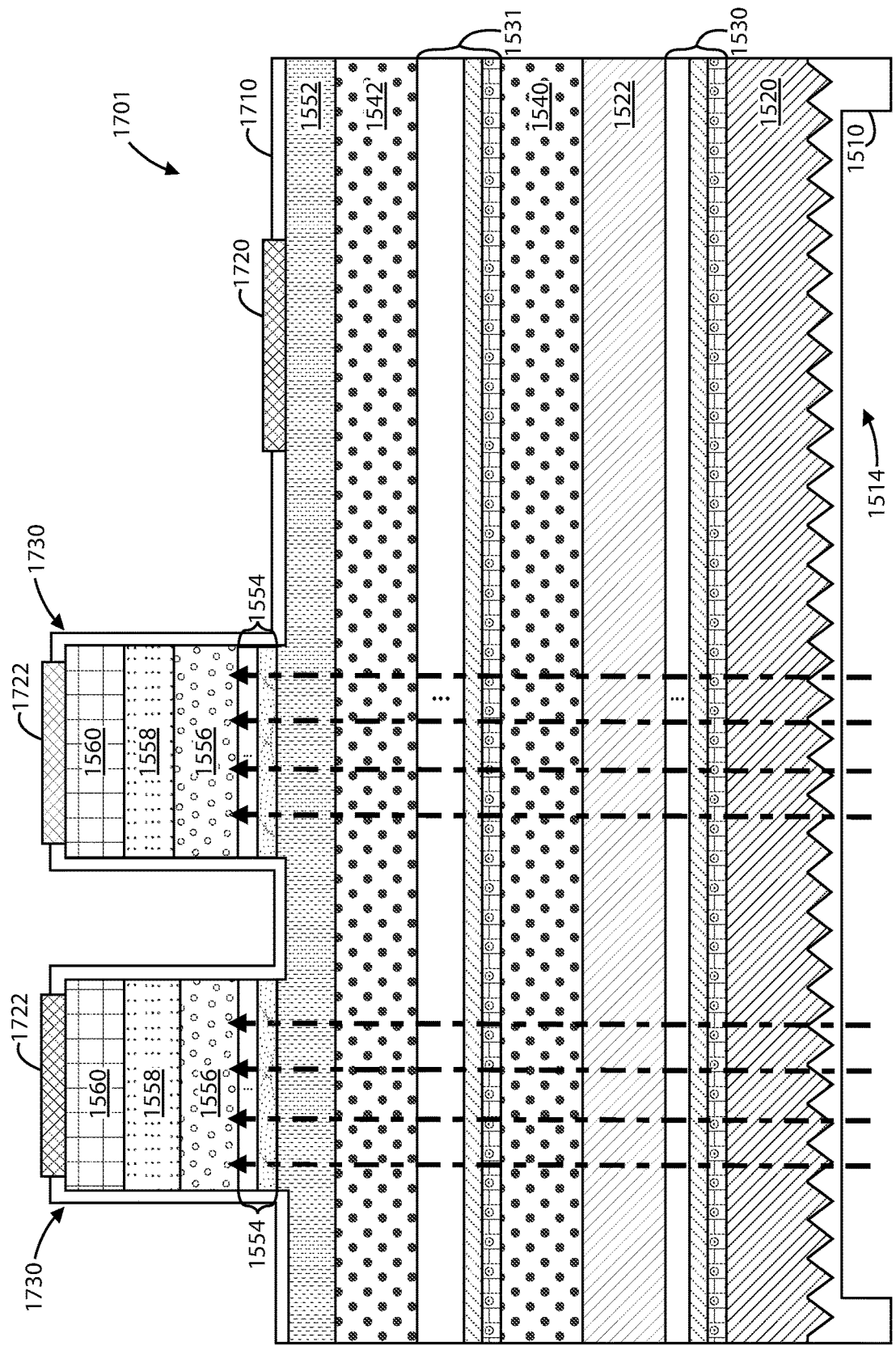
FIGS. 17A and 17B are simplified diagrams illustrating cross-sectional views of backside illumination and frontside illumination mesa-type sensor devices using wavelength configuring materials and selectively transparent buffer materials according to examples of the present invention.
Figure 17B:
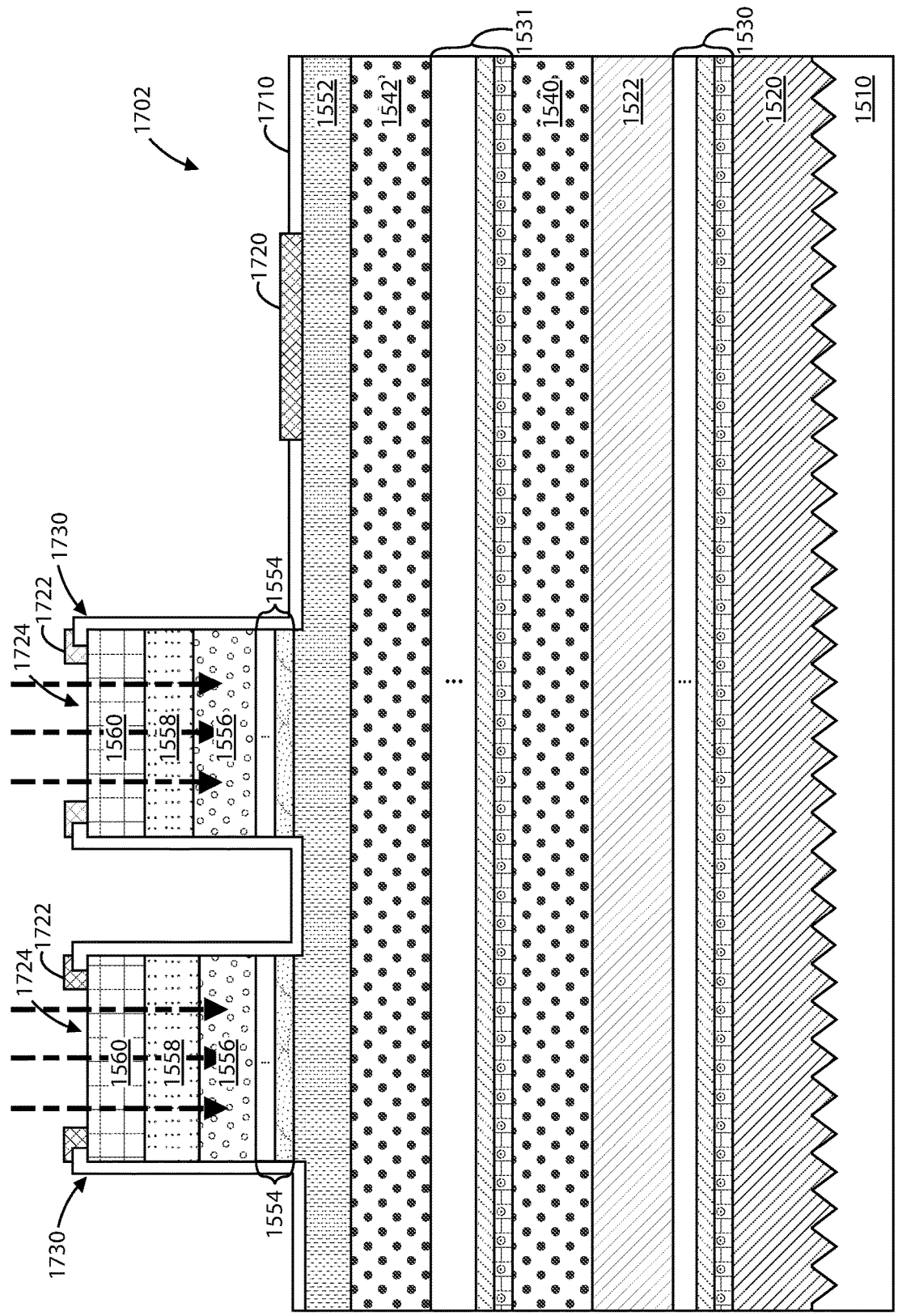

FIGS. 17A and 17B are simplified diagrams illustrating cross-sectional views of backside illumination and frontside illumination mesa-type sensor devices using wavelength configuring materials and selectively transparent buffer materials according to examples of the present invention. The method steps illustrated in these figures can be combined with any method steps discussed previously for forming a photodetector device. Further, the same numerals across these figures and previous figures refer to the same elements, regions, configurations, etc.

FIG. 17A shows a mesa-type sensor device 1701 in a backside illumination configuration. Here, the device layers 1554-1560 are configured in mesa-type sensor units 1730 with a passivation material 1710 overlying the top surface region of the mesa-type units 1730 (i.e., p-type contact region 1560) and the n-type contact region 1552. The passivation material 1710 can include silicon oxide, silicon nitride, aluminum oxide, or polymer materials, and the like. Portions of the passivation material can be removed (e.g., wet etching, dry etching, etc.) exposing portions of the p-type and n-type contact regions for metal contact formation. As shown, an n-metal contact 1720 is formed overlying a portion of the n-type contact region 1552 and p-metal contacts 1722 are formed overlying the sensor units 1730.

In this backside illumination configuration, the silicon substrate is thinned or etched to include a cavity region 1514. This cavity region 1514 allows more photons to travel through the material layers (shown by the dotted-line arrows) from the backside to the absorption region 1556 of the sensor units 1730. This configuration can improve responsivity and quantum efficiency of a resulting photodetector array, or other similar sensor device.

FIG. 17B shows a mesa-type sensor device 1702 in a topside illumination configuration. Compared to device 1701, this device 1702 does not have a thinned substrate or a cavity region in the silicon substrate 1510. Instead, a portion (e.g., a center portion) of the p-metal contacts 1722 are removed to form p-metal cavities 1724 that expose portions of the p-type contact regions 1560. This allows photons to travel through the material layers (shown by the dotted-line arrows) from the topside to the absorption region 1556 of the sensor units 1730. This configuration can enable a simplified fabrication process without the need for further processing of the substrate 1510.

Figure 18A:
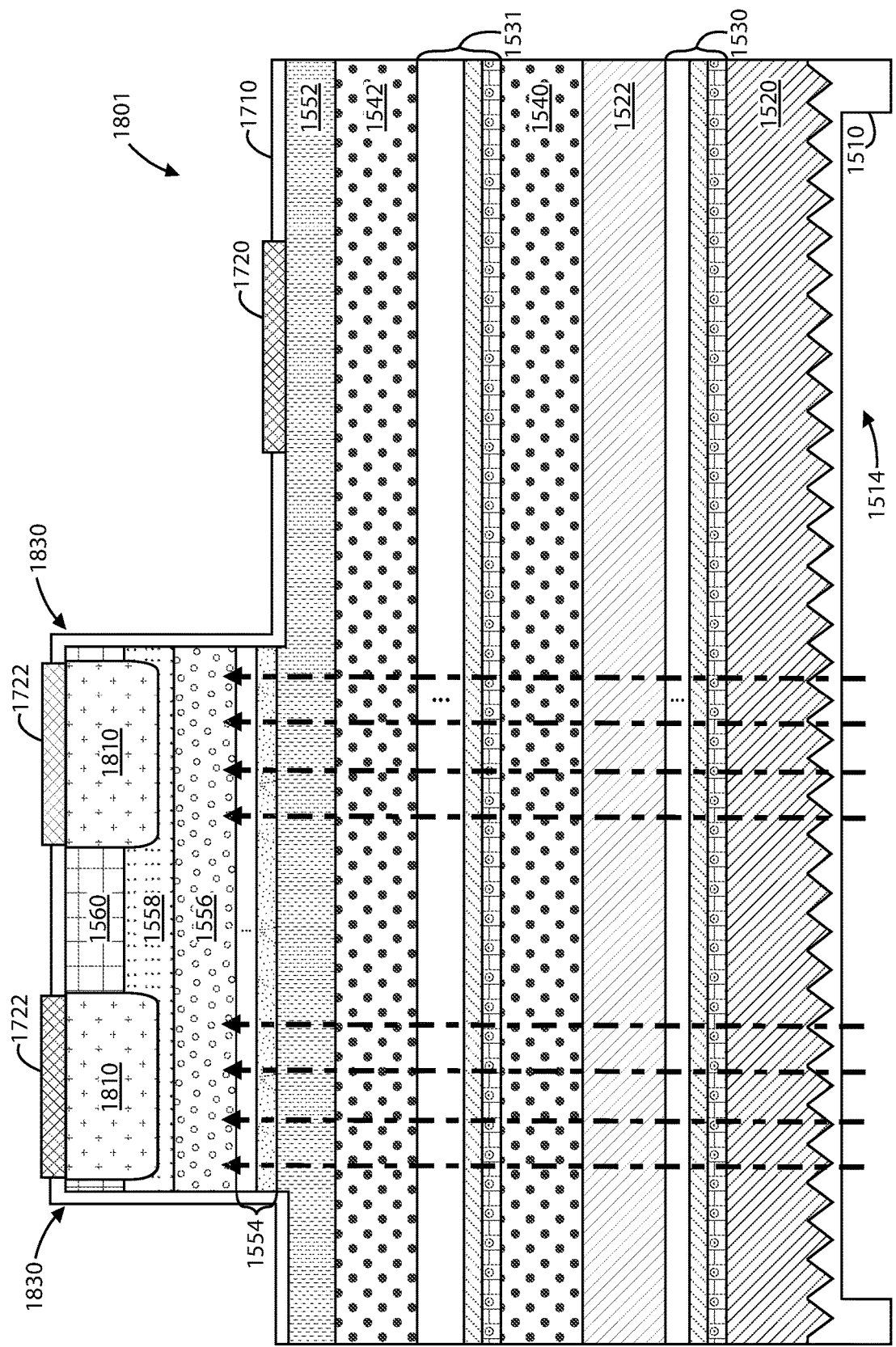
FIGS. 18A and 18B are simplified diagrams illustrating cross-sectional views of backside illumination and frontside illumination planar-type sensor devices using wavelength configuring materials and selectively transparent buffer materials according to examples of the present invention.
Figure 18B:
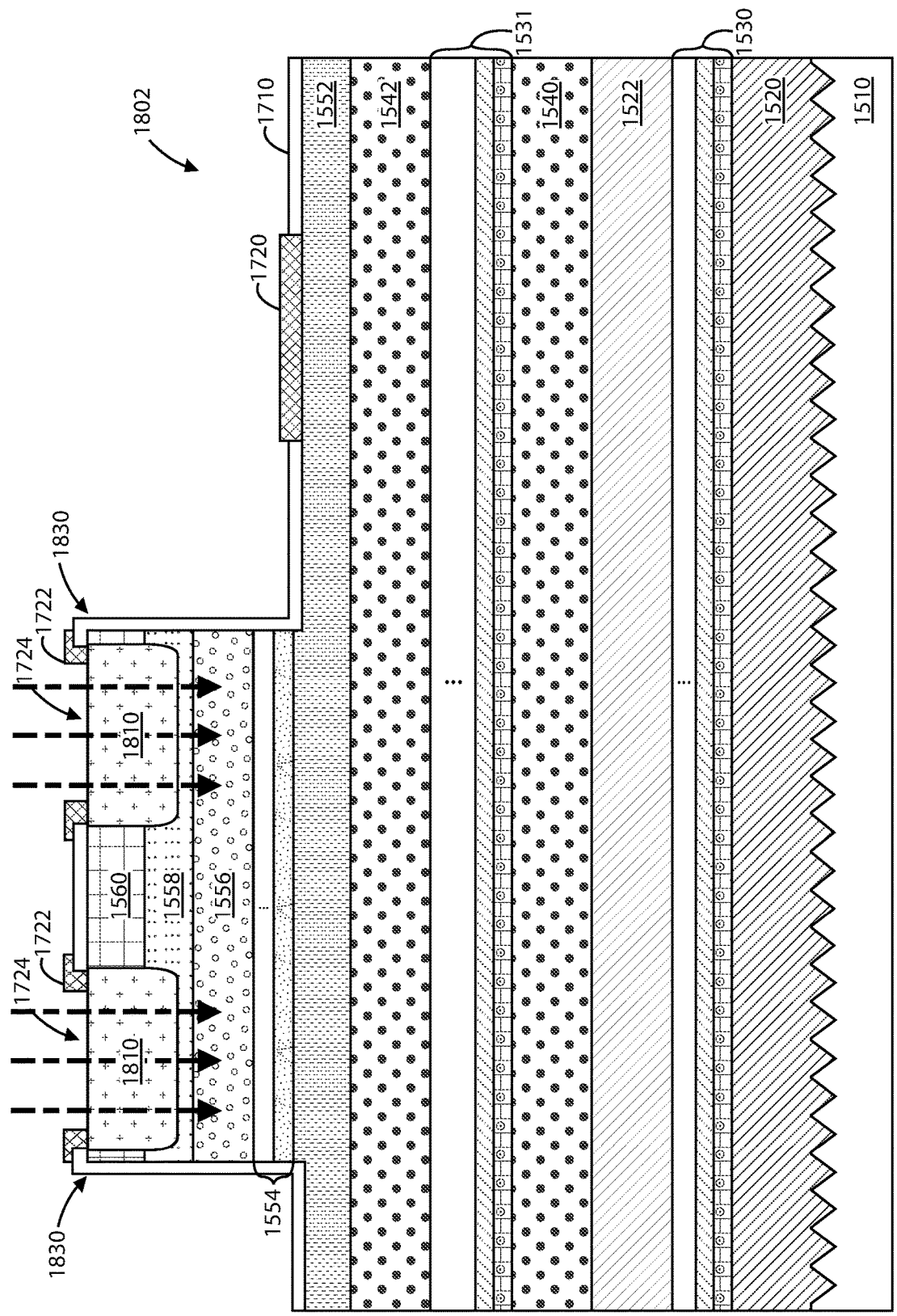

FIGS. 18A and 18B are simplified diagrams illustrating cross-sectional views of backside illumination and frontside illumination planar-type sensor devices using wavelength configuring materials and selectively transparent buffer materials according to examples of the present invention. The method steps illustrated in these figures can be combined with any method steps discussed previously for forming a photodetector device. Further, the same numerals across these figures and previous figures refer to the same elements, regions, configurations, etc.

FIG. 18A shows a planar-type sensor device 1801 in a backside illumination configuration. Here, the device layers 1554-1560 are configured as sensor units 1830 within a planar structure with a passivation material 1710 overlying the top surface region of the planar structure (i.e., p-type contact region 1560) and the n-type contact region 1552. Each sensor unit 1830 includes a diffused p-type region 1810 (or p-regions), which can be formed within at least a portion of the p-type contact region 1560 and can be formed within a portion of the p-type spacer region 1558 as well. These diffused p-regions 1810 can be formed with similar dopants and processes discussed previously. In a specific example, the diffused p-regions 1810 can include a Zn diffusion p-region.

Similar to device 1701, an n-metal contact 1720 is formed overlying an exposed portion of the n-type contact region 1552 and p-metal contacts 1722 are formed overlying the exposed portions of the sensor units 1830. Similarly, the silicon substrate is thinned or etched to include a cavity region 1514, which allows more photons to travel through the material layers (shown by the dotted-line arrows) from the backside to the absorption region 1556 of the sensor units 1830. In addition to the benefits discussed previously, this configuration can potentially lower the dark current of the resulting photodetector array, or similar sensor device.

FIG. 18B shows a planar-type sensor device 1802 in a topside illumination configuration. Similar to device 1802, the device layers 1554-1560 are configured as sensor units 1830 within a planar structure, and, similar to device 1702, p-metal cavities 1724 that expose portions of the p-type contact regions 1560, allows photons to travel through the material layers (shown by the dotted-line arrows) from the topside to the absorption region 1556 of the sensor units 1830. This configuration can also provide the benefits described previously for device 1801. Those of ordinary skill in the art will recognize other variations, modifications, and alternatives to the application of the wavelength configuring material.

Figure 19A:
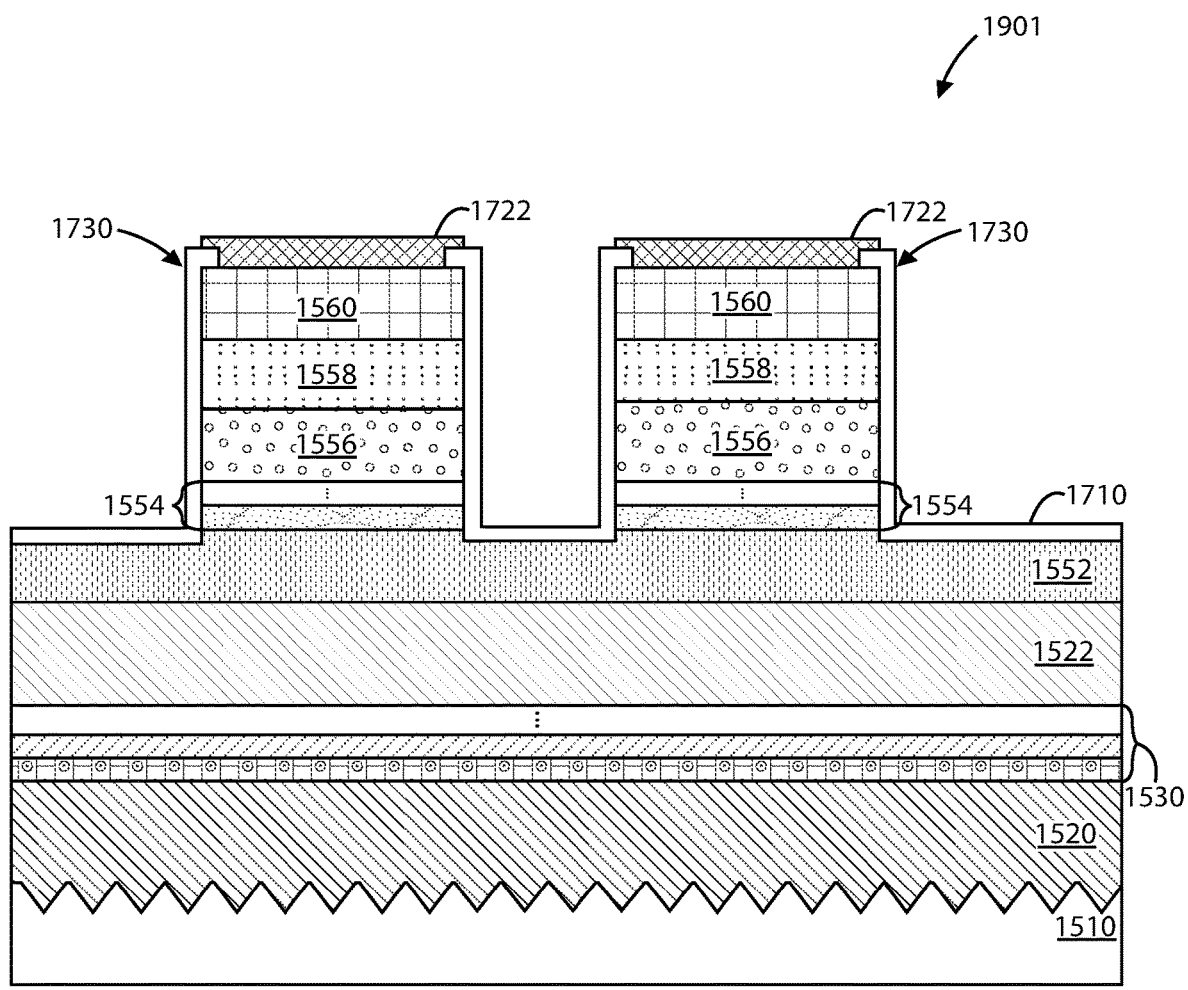
FIGS. 19A and 19B are simplified diagrams illustrating cross-sectional views of sensor devices according to examples of the present invention.
Figure 19B:
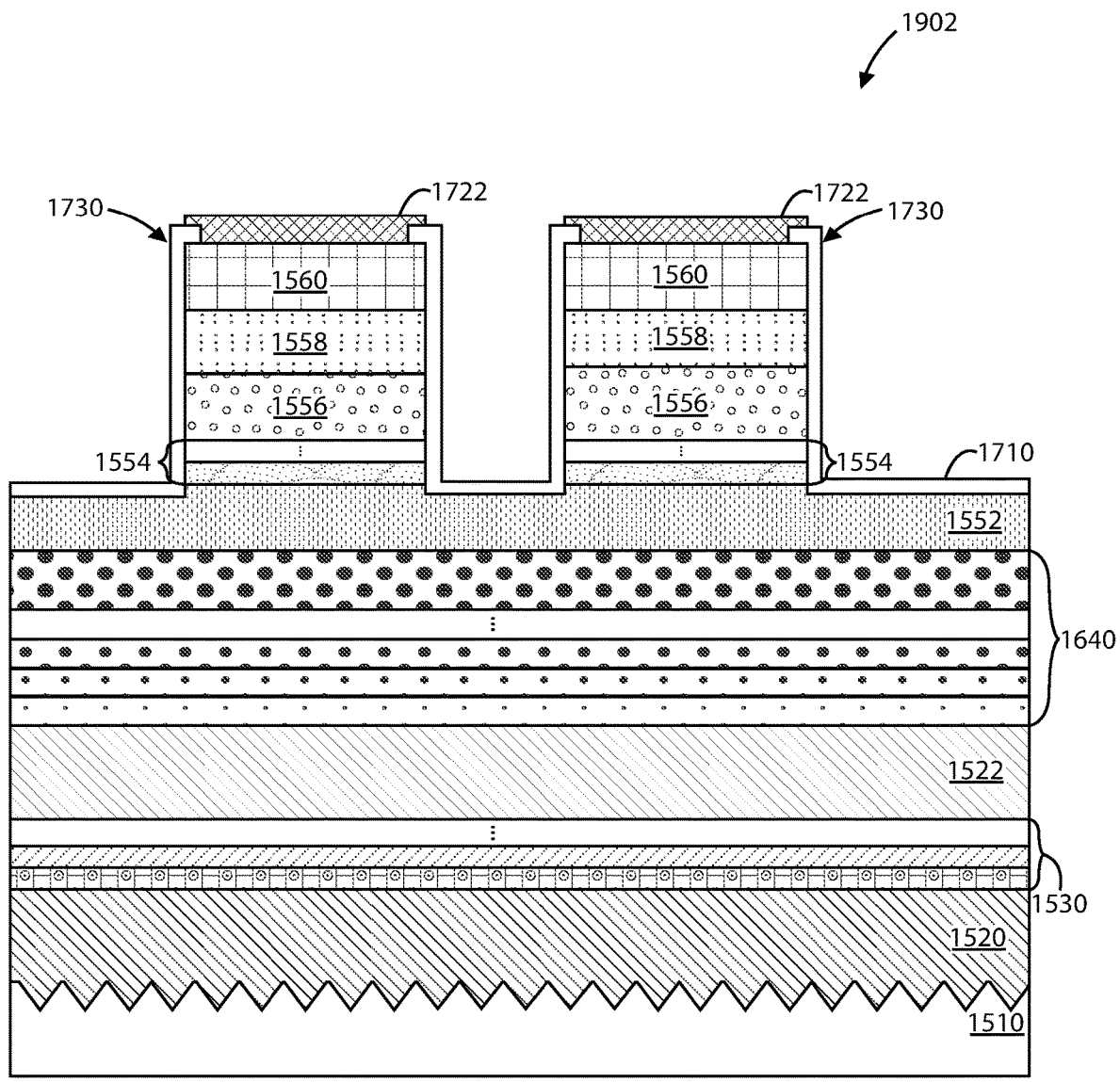

FIGS. 19A to 19B are simplified diagrams illustrating cross-sectional views of mesa-type sensor devices (devices 1901 to 1902) according to examples of the present invention. More specifically, these examples include InGaAs sensor devices tailored for different wavelengths (e.g. 905 nm to 940 nm). The elements and techniques illustrated in these figures can be configured similarly to or combined with any previous device elements and method steps (e.g., planar-type device configurations). Further, the same numerals across these figures refer to the same elements, regions, configurations, etc.

Compound semiconductor (CS) materials, such as InGaAs, demonstrate better electrical and optical characteristics than silicon for certain applications, including near infrared detection. InGaAs, and other CS materials, can be deposited on non-native substrates, such as GaAs and Si, in order to manufacture at scale and with lower cost. FIG. 19A shows an example mesa-type sensor device 1901 using such CS materials. In a specific example, the first and second buffer materials 1520, 1522 can include GaAs buffer materials. Also, the n-type contact region 1552 can include an n+ GaAs contact region, the p-type spacer region 1558 can include a p-GaAs spacer region, and the p-type contact region 1560 can include a p+ GaAs contact region. Further, the absorption region 1556 can include a strained $In_xGa_{1-x}As$ (P) absorption region the device 1901 can be configured with topside and backside transparency.

FIG. 19B shows a mesa-type sensor device 1902 configured with graded wavelength configuring materials and CS materials. In a specific example, the first and second buffer materials 1520, 1522 can include GaAs buffer materials, and the graded region 1640 can include a graded $In_zGa_{1-z}As$ region. Also, the n-type contact region 1552 can include an n+ $In_zGa_{1-z}As$ contact region, the absorption region 1556 can include a $In_zGa_{1-z}As$ absorption region, the p-type spacer region 1558 can include a p– $In_xGa_{1-x}As_yP_{1-y}$ spacer region or a p– InAlAs spacer region, and the p-type contact region 1560 can include a p+ $In_xGa_{1-x}As_yP_{1-y}$ contact region or a p+ InAlAs contact region. Further, the buffer materials 1520, 1522 can be configured as relaxed buffer materials, and the absorption region 1556 can include a lattice-matched absorption region and the device 1902 can be configured with topside transparency.

In a specific example, the first and second buffer materials 1520, 1522 can include GaAs buffer materials, and the graded region 1640 can include a graded $In_zGa_{1-z}P$ region or a graded $In_zAl_{1-z}As$ region. Also, the n-type contact region 1552 can include an n+ $In_zGa_{1-z}P$ contact region or an n+ $In_zAl_{1-z}As$ contact region, the absorption region 1556 can include a $In_zGa_{1-z}As$ absorption region, the p-type spacer region 1558 can include a p– $In_zGa_{1-z}As$ spacer region, and the p-type contact region 1560 can include a p+ $In_zGa_{1-z}As$ contact region. Further, the buffer materials 1520, 1522 can be configured as relaxed buffer materials, and the absorption region 1556 can include a lattice-matched absorption region and the device 1902 can be configured with backside transparency.

In a specific example, the first and second buffer materials 1520, 1522 can include GaAs buffer materials, and the graded region 1640 can include a graded $In_zGa_{1-z}P$ region or a graded $In_zAl_{1-z}As$ region. Also, the n-type contact region 1552 can include an n+ $In_zGa_{1-z}P$ contact region or an n+ $In_zAl_{1-z}As$ contact region, the absorption region 1556 can include a $In_zGa_{1-z}As$ absorption region, the p-type spacer region 1558 can include a p– $In_zGa_{1-z}P$ spacer region or a p– $In_zAl_{1-z}As$ spacer region, and the p-type contact region 1560 can include a p+ $In_zGa_{1-z}P$ contact region or a p+ $In_zAl_{1-z}As$ contact region. Further, the buffer materials 1520, 1522 can be configured as relaxed buffer materials, and the absorption region 1556 can include a lattice-matched absorption region and the device 1902 can be configured with topside and backside transparency.

The embodiments shown in FIGS. 19A and 19B and described previously are merely examples of sensor devices configured with a 900 nm compliant substrate. Such sensor devices may have different combinations of materials and configurations, including any of those materials and configurations described herein. Those of ordinary skill in the art will recognize other variations, modifications, and alternatives.

Figure 20A:
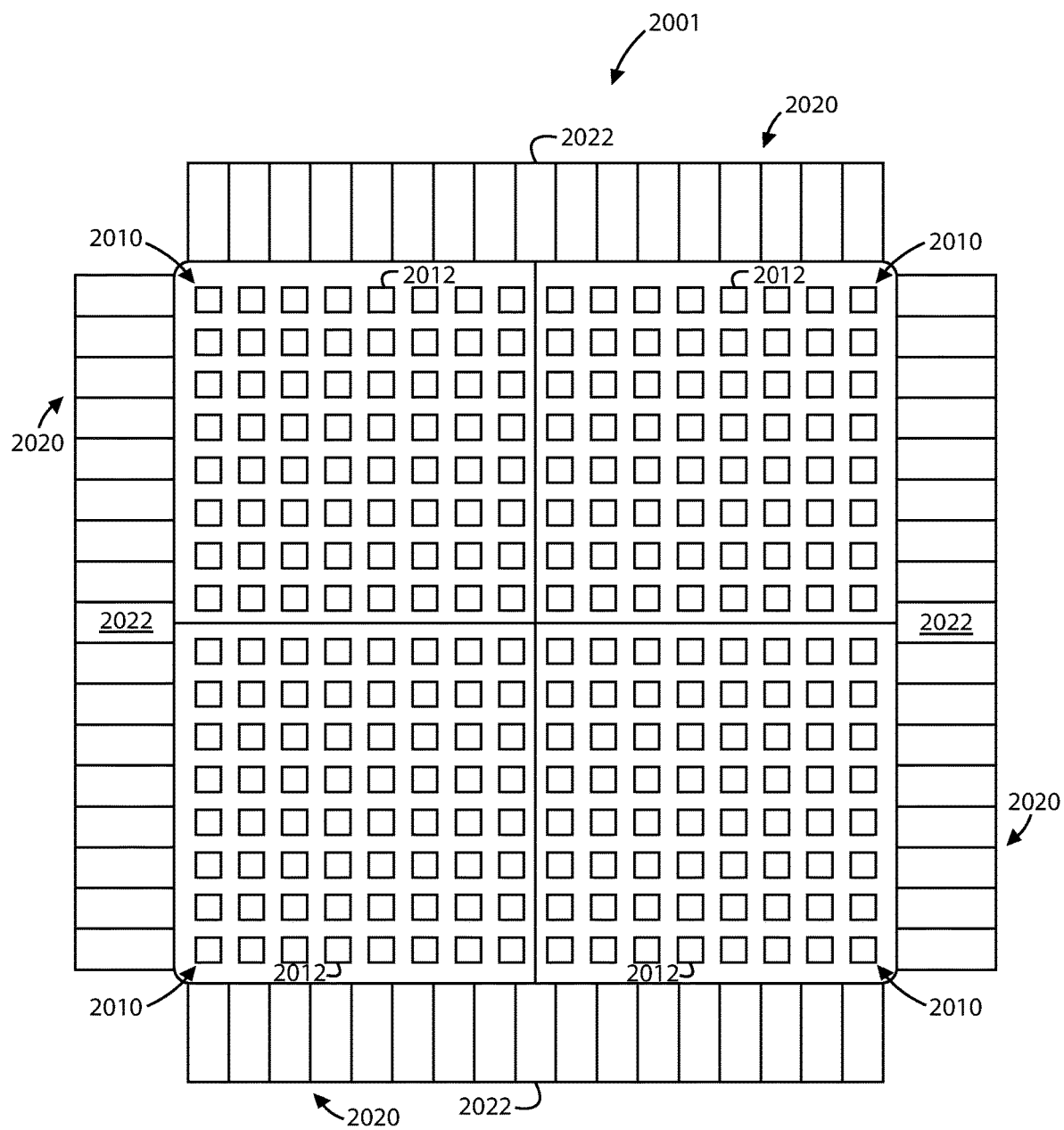
FIGS. 20A-20C are simplified diagrams illustrating a single photon avalanche detector (SPAD)/photomultiplier (PM) array circuit device according to examples of the present invention.
Figure 20B:
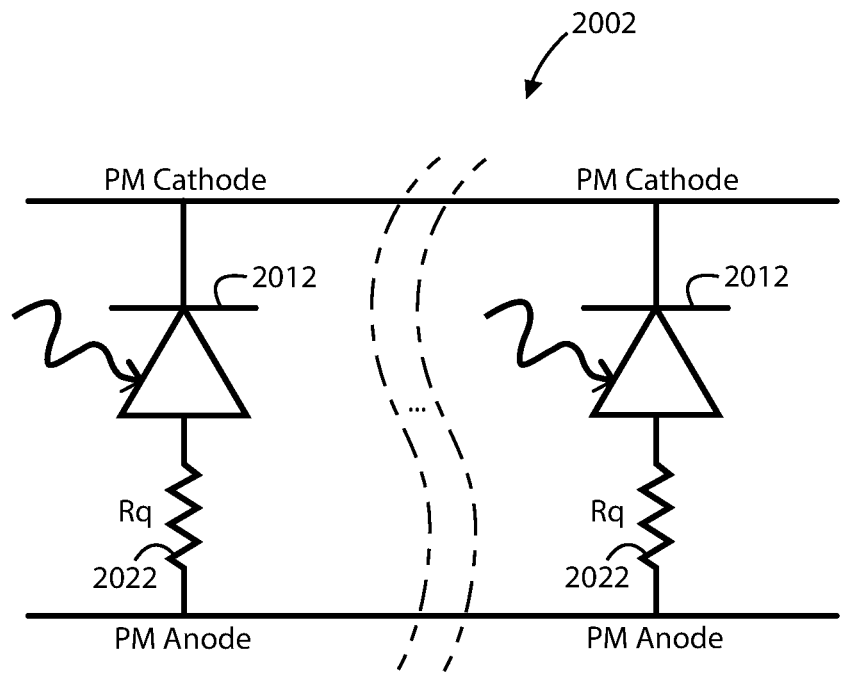
Figure 20C:
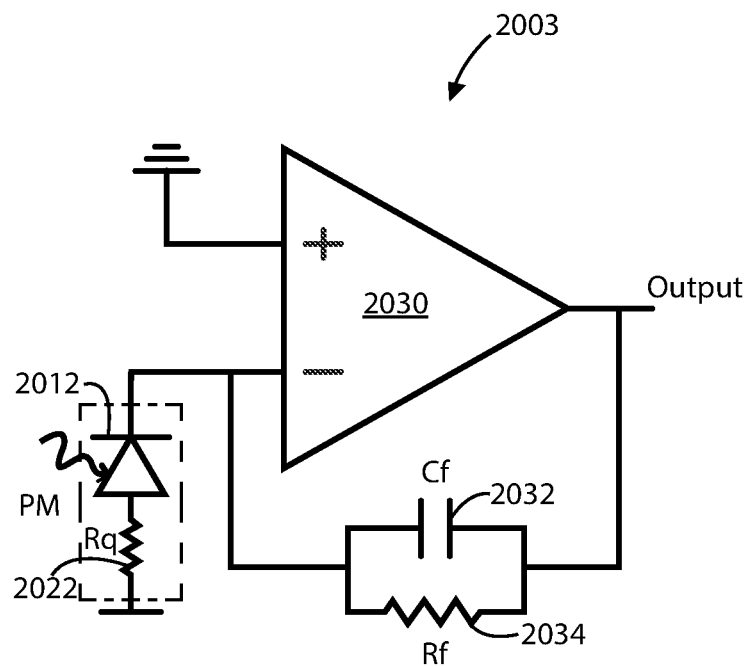

FIGS. 20A-20C are simplified diagrams illustrating a single photon avalanche detector (SPAD)/photomultiplier (PM) array circuit device according to examples of the present invention. Compared to conventional Si SPAD devices, the present SPAD devices (e.g., InGaAs SPAD devices, or the like) can exhibit greater quantum efficiency. The thin silicon layer in Si SPAD devices is more vulnerable to reaching breakdown, but Si PIN diode or photodetector devices can achieve higher QE because the Si epi layer can be formed thicker compared to conventional Si SPAD devices.

FIG. 20A is a simplified diagram illustrating a photodetector array circuit device according to an example of the present invention. As shown, the device 2001 includes one or more photodetector arrays 2010 configured with one or more quenching resistor regions 2020. Each array 2010 includes a plurality of photodetector devices 2012, and each quenching resistor region 2020 includes a plurality of quenching resistors 2022. In this case, the arrays are configured in a square grid with a quenching resistor region 2020 on each side of the outer perimeter. In a specific example, this photodetector array circuit device can be configured as a SPAD device, a PM device, or the like.

FIG. 20B is a simplified circuit diagram illustrating a photodetector circuit device according to an example of the present invention. As shown, device 2002 includes a plurality of PM cells coupled in parallel. Each cell includes a SPAD device 2012 coupled in series to a quenching resistor (Rq) 2022. These PM cells can also be coupled to a PM cathode on one end and to a PM anode on the other end. Depending on the materials and configurations of the photodetector device, the resulting SPAD device (e.g., InGaAs SPAD) can be configured in a PM device, which can exhibit improved quantum efficiency and improve high speed performance.

FIG. 20C is a simplified circuit diagram illustrating an amplifier circuit device according to an example of the present invention. As shown, device 2003 includes a PM cell (shown within the dotted lines) with a SPAD device 2012 coupled in series to a quenching resistor 2022 and a voltage bias (e.g., −31V). Also, device 2003 has an amplifier 2032 with a positive terminal coupled to a ground node and a negative terminal coupled to the PM cell. Further, the amplifier 2030 is configured in a negative feedback loop with a feedback resistor (Rf) and a feedback capacitor (Cf) coupled in parallel between the amplifier output and the negative terminal. Those of ordinary skill in the art will recognize other variations, modifications, and alternatives to these SPAD and PM configurations.

Figure 21A:
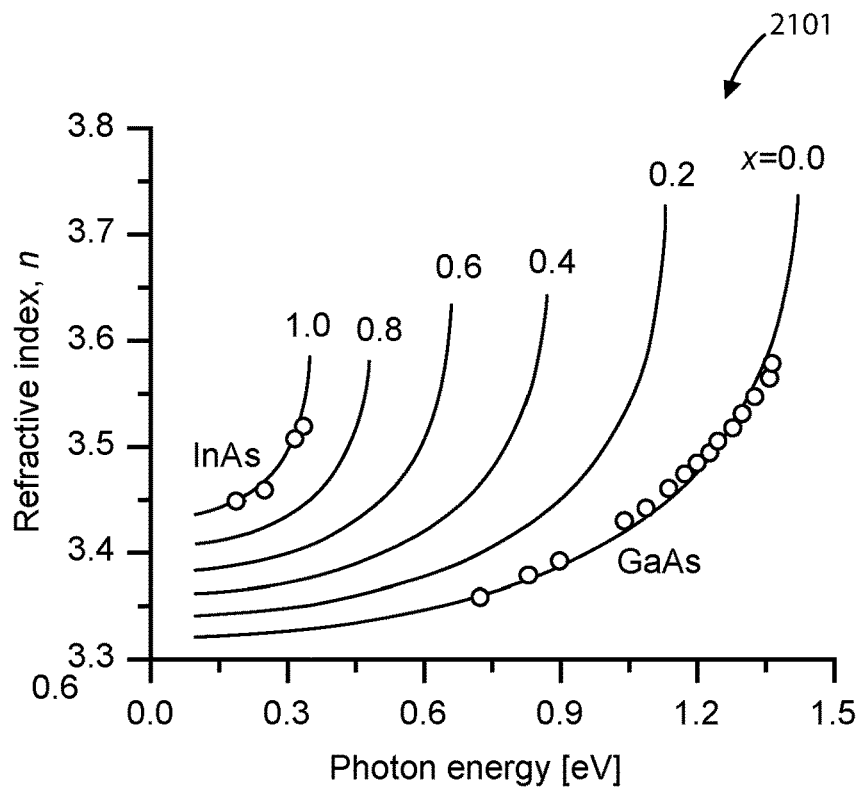
FIGS. 21A-21D are simplified graphs illustrating device characteristics of a photodetector array circuit device according to an example of the present invention.

FIGS. 21A-21D are simplified graphs illustrating device characteristics of a photodetector array circuit device according to examples of the present invention. FIG. 21A shows graph 2101 of the refractive index over photon energy of devices with different materials, including InAs and GaAs. As shown, the refractive index curves of each sensor material type is exhibited at different energy ranges.

Figure 21B:
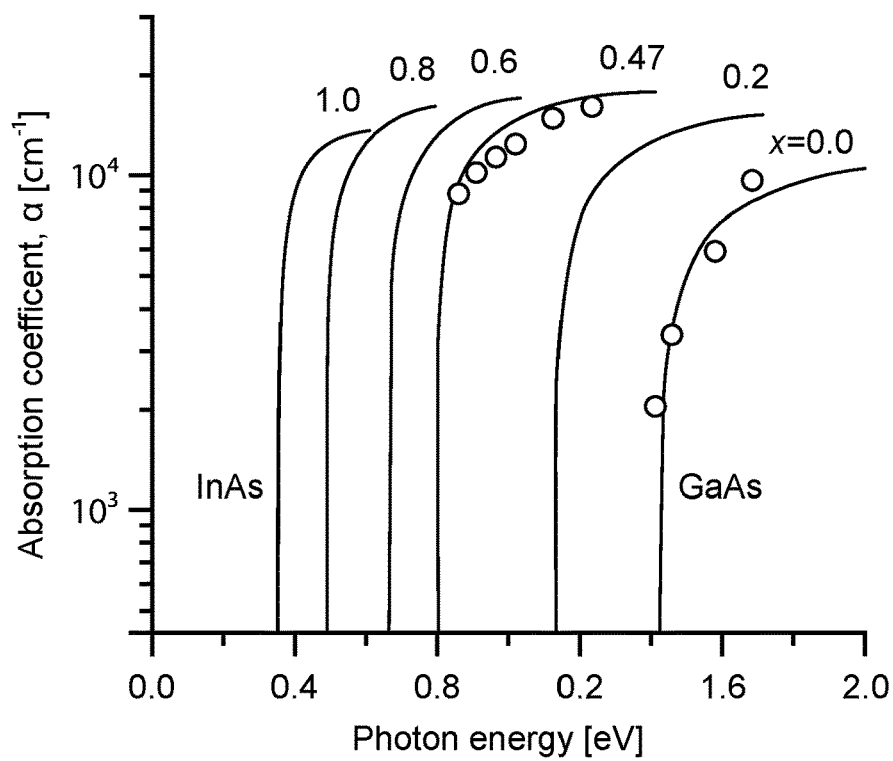

FIG. 21B shows graph 2102 of the absorption coefficient over photon energy of devices with different materials, including InAs and GaAs. As shown, the absorption coefficient curves of each sensor material type is exhibited at different energy ranges.

Figure 21C:
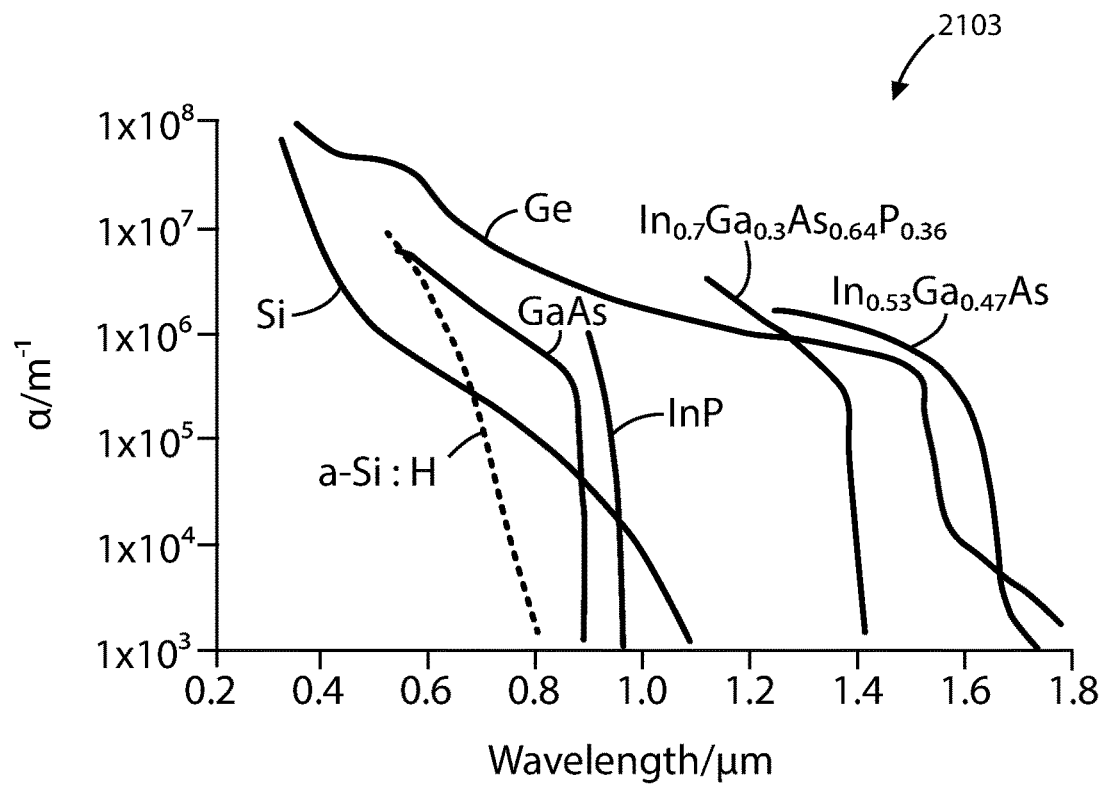

FIG. 21C shows graph 2103 of the absorption coefficient over wavelength of devices with different materials, including Si, a-Si: H, Ge, GaAs, InP, $In_{0.7}Ga_{0.3}As_{0.64}P_{0.36}$, and $In_{0.53}Ga_{0.47}As$. As shown, the absorption coefficient curves of each sensor material type is exhibited at different wavelength ranges.

Figure 21D:
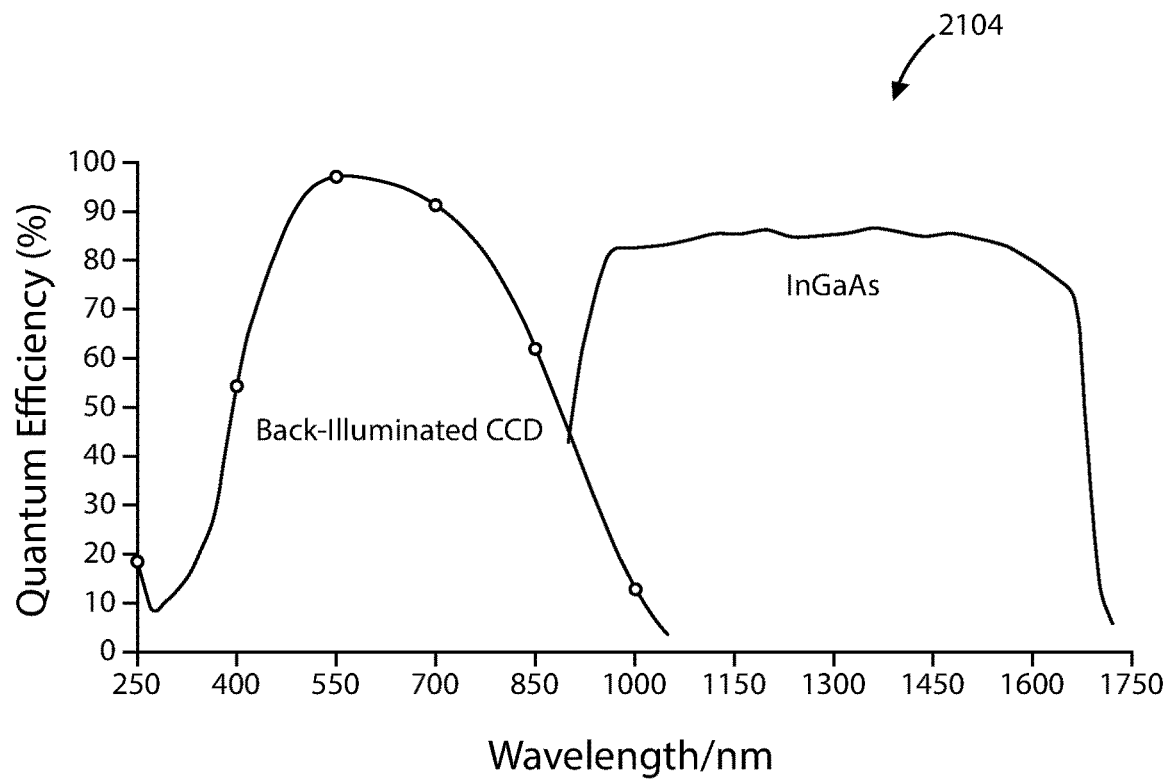

FIG. 21D shows graph 2104 of the quantum efficiency over wavelength of a back-illuminated CCD sensor and an InGaAs sensor according to an example of the present invention. As shown, the peak quantum efficiency of each sensor type is exhibited within different wavelength ranges.

While the above is a full description of the specific embodiments, various modifications, alternative constructions, and equivalents may be used. As an example, the packaged device can include any combination of elements described above, as well as outside of the present specification. Therefore, the above description and illustrations should not be taken as limiting the scope of the present invention which is defined by the appended claims.

What is claimed is:

1. A sensor device configured for a selected wavelength, the device comprising:
 a silicon substrate comprising a backside region and a frontside region, wherein the silicon substrate comprises a plurality of v-grooves formed within the frontside region;
 a first GaAs buffer region overlying the plurality of v-grooves;
 a defect filter layer (DFL) region overlying the first GaAs buffer region;
 a second GaAs buffer region overlying the DFL region;
 an n+ GaAs contact region overlying the second GaAs buffer region;
 a strained $In_xGa_{1-x}As$ (P) absorber region overlying the n+ GaAs contact region;
 a p-GaAs spacer region overlying the $In_xGa_{1-x}As$ (P) absorber region; and
 a p+ GaAs contact region overlying the p-GaAs spacer region.

2. The device of claim 1 wherein the selected wavelength ranges from about 900 nm to about 940 nm.

3. The device of claim 1 wherein the DFL region comprises one or more DFLs overlying the first GaAs buffer region, wherein the DFL region comprises one or more spacer layers overlying the first GaAs buffer region, and wherein the one or more spacer layers and the one or more DFLs are configured in an alternating pattern.

4. The device of claim 1 wherein the silicon substrate comprises a substrate cavity region, and further comprising a backside illumination region configured within the substrate cavity region to allow one or more photons to be absorbed by a portion of the $In_xGa_{1-x}As$ (P) absorber region.

5. The device of claim 1 further comprising a top-side illumination region configured within at least a portion of the p-type contact region to allow a plurality of photons to be absorbed by a portion of the $In_xGa_{1-x}As$ (P) absorber region.

6. The device of claim 1 wherein the n+ GaAs contact region, the $In_xGa_{1-x}As$ (P) absorber region, the p-GaAs spacer region, and the p+ GaAs contact region form a single photon avalanche detector (SPAD) device.

7. The device of claim 6 further comprising a quenching resistor coupled to the SPAD device to form a photomultiplier (PM) cell, the PM cell being configured within a PM array device.

8. A sensor device configured for a selected wavelength, the device comprising:

a silicon substrate comprising a backside region and a frontside region, wherein the silicon substrate comprises a plurality of v-grooves formed within the frontside region;

a first GaAs buffer region overlying the plurality of v-grooves;

a defect filter layer (DFL) region overlying the first GaAs buffer region;

a second GaAs buffer region overlying the DFL region, wherein the first and second GaAs buffer regions comprise relaxed GaAs buffer regions;

a wavelength configuring material overlying the second GaAs buffer region, the wavelength configuring material comprising a graded region configured for a selected 9 wavelength, the graded region comprising a plurality of material regions configured in order of concentration with respect to at least a first element concentration including $In_zGa_{1-z}As$, $In_zGa_{1-z}P$, or $In_zAl_{1-z}As$; and wherein the plurality of material regions includes an interface region between each adjacent pair of the material regions;

an n-type contact region overlying the wavelength configuring material, the n-type contact region comprising an n+ $In_zGa_{1-z}As$ contact region, an n+ $In_zGa_{1-z}P$ contact region, or an n+ $In_zAl_{1-z}As$ contact region;

an absorber region overlying the n-type contact region, the absorber region comprising an $In_zGa_{1-z}As$ absorber region;

a p-type spacer region overlying the absorber region, the p-type spacer region comprising a p– $In_xGa_{1-x}As_yP_{1-y}$ spacer region, a p– InAlAs spacer region, a p– $In_zGa_{1-z}As$ spacer region, a p-$In_zGa_{1-z}P$ spacer region, or a p– $In_zAl_{1-z}As$ spacer region; and a p-type contact region overlying the p-type spacer region, the p-type contact region comprising a p+ $In_xGa_{1-x}As_yP_{1-y}$ contact region, a p+ InAlAs contact region, a p+ $In_zGa_{1-z}As$ contact region, a p+ $In_zGa_{1-z}P$ contact region, or a p+ $In_zAl_{1-z}As$ contact region.

9. The device of claim 1 wherein the selected wavelength ranges from about 905 nm to about 940 nm.

10. The device of claim 7 wherein the DFL region comprises one or more DFLs overlying the first GaAs buffer region, wherein the DFL region comprises one or more spacer layers overlying the first GaAs buffer region, and wherein the one or more spacer layers and the one or more DFLs are configured in an alternating pattern.

11. The device of claim 7 wherein the silicon substrate comprises a substrate cavity region, and further comprising a backside illumination region configured within the substrate cavity region to allow one or more photons to interact with the wavelength configuring material and be absorbed by a portion of the absorber region.

12. The device of claim 7 further comprising a top-side illumination region configured within at least a portion of the p-type contact region to allow a plurality of photons to be absorbed by a portion of the $In_xGa_{1-x}As$ (P) absorber region.

13. The device of claim 7 wherein the n+ GaAs contact region, the $In_xGa_{1-x}As$ (P) absorber region, the p-GaAs spacer region, and the p+ GaAs contact region form a single photon avalanche detector (SPAD) device.

14. The device of claim 13 further comprising a quenching resistor coupled to the SPAD device to form a photomultiplier (PM) cell, the PM cell being configured within a PM array device.

15. A sensor device configured for a selected wavelength, the device comprising:

a first terminal;
a second terminal;
a silicon substrate comprising a backside region and a frontside region, wherein the silicon substrate comprises a plurality of v-grooves formed within the frontside region;

a first GaAs compound semiconductor (CS) buffer region overlying the plurality of v-grooves;

a defect filter layer (DFL) region overlying the first GaAs buffer region;

a second GaAs CS buffer region overlying the DFL region;

an array of photomultiplier (PM) devices overlying the second GaAs CS buffer region, the array being characterized by N and M pixel elements, each of the PM devices comprising an n-type contact region overlying the second GaAs CS buffer region, the n-type contact region comprising an n+ GaAs contact region, an n+ $In_zGa_{1-z}As$ contact region, an n+ $In_zGa_{1-z}P$ contact region, or an n+ $In_zAl_{1-z}As$ contact region;

an absorber region overlying the n-type contact region, the absorber region comprising a strained $In_xGa_{1-x}As$ (P) absorber region or an $In_zGa_{1-z}As$ absorber region;

a p-type spacer region overlying the absorber region, the p-type spacer region comprising a p-GaAs spacer region, a p– $In_xGa_{1-x}As_yP_{1-y}$ spacer region, a p– InAlAs spacer region, a p-$In_zGa_{1-z}As$ spacer region, a p-$In_zGa_{1-z}P$ spacer region, or a p– $In_zAl_{1-z}As$ spacer region;

a p-type contact region overlying the p-type spacer region, the p-type contact region comprising a p+ GaAs spacer region, a p+ $In_xGa_{1-x}As_yP_{1-y}$ contact region, a p+ InAlAs contact region, a p+ $In_zGa_{1-z}As$ contact region, a p+ $In_zGa_{1-z}P$ contact region, or a p+ $In_zAl_{1-z}As$ contact region;

wherein the n-type contact region, the absorber region, the p-type spacer region, and the p-type contact region form a single photon avalanche detector (SPAD) device;

a quenching resistor coupled to the SPAD device;

a first electrode coupled to the n-type contact material and the first terminal; and a second electrode coupled to the p-type contact material and the second terminal.

16. The device of claim 14 wherein the selected wavelength ranges from about 905 nm to about 940 nm.

17. The device of claim 14 wherein the DFL region comprises one or more DFLs overlying the first GaAs buffer region, wherein the DFL region comprises one or more spacer layers overlying the first GaAs buffer region, and wherein the one or more spacer layers and the one or more DFLs are configured in an alternating pattern.

18. The device of claim 14 wherein the silicon substrate comprises a substrate cavity region, and further comprising a backside illumination region configured within the substrate cavity region to allow one or more photons to be absorbed by a portion of the absorber region.

19. The device of claim 14 further comprising a top-side illumination region configured within at least a portion of the p-type contact region to allow a plurality of photons to be absorbed by a portion of the absorber region.

20. The device of claim 14 wherein the first and second GaAs CS buffer regions comprise relaxed GaAs CS buffer regions; and further comprising a graded wavelength configuring material overlying the second GaAs CS buffer region; wherein the array of PM devices is configured overlying the graded wavelength material; and wherein the graded wavelength configuring material comprises a plurality of material regions configured in order of concentration with respect to at least a first element concentration including $In_zGa_{1-z}As$, $In_zGa_{1-z}P$, or $In_zAl_{1-z}As$.

* * * * *